(12) United States Patent
Hwang et al.

(10) Patent No.: US 9,208,885 B2
(45) Date of Patent: Dec. 8, 2015

(54) VERTICAL STRUCTURE SEMICONDUCTOR MEMORY DEVICES AND METHODS OF MANUFACTURING THE SAME

(71) Applicants: Sung-Min Hwang, Seoul (KR); Hansoo Kim, Suwon-si (KR); Sun-Il Shim, Seoul (KR)

(72) Inventors: Sung-Min Hwang, Seoul (KR); Hansoo Kim, Suwon-si (KR); Sun-Il Shim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/920,926

(22) Filed: Jun. 18, 2013

(65) Prior Publication Data

US 2013/0286735 A1 Oct. 31, 2013

Related U.S. Application Data

(62) Division of application No. 13/081,776, filed on Apr. 7, 2011, now Pat. No. 8,492,797.

(30) Foreign Application Priority Data

Jun. 7, 2010 (KR) ........................ 10-2010-0053600

(51) Int. Cl.
*H01L 27/088* (2006.01)
*G11C 16/08* (2006.01)
*H01L 27/115* (2006.01)
*H01L 29/78* (2006.01)
*H01L 23/48* (2006.01)

(52) U.S. Cl.
CPC ................ *G11C 16/08* (2013.01); *H01L 23/48* (2013.01); *H01L 27/088* (2013.01); *H01L 27/11551* (2013.01); *H01L 27/11556* (2013.01); *H01L 27/11578* (2013.01); *H01L 27/11582* (2013.01); *H01L 29/7827* (2013.01); *H01L 2924/0002* (2013.01)

(58) Field of Classification Search
CPC ............ H01L 29/792; H01L 29/66833; H01L 27/115; H01L 27/11568; H01L 21/28282
USPC ................................................. 257/324, 773
See application file for complete search history.

(56) References Cited

U.S. PATENT DOCUMENTS 7,696,559 B2    4/2010  Arai et al.
2009/0146190 A1  6/2009  Fukuzumi et al.
2010/0327339 A1*  12/2010  Tanaka et al. .................. 257/324

* cited by examiner

*Primary Examiner* — Monica D Harrison
(74) *Attorney, Agent, or Firm* — Harness, Dickey & Pierce, P.L.C.

(57) ABSTRACT

A semiconductor memory device includes: a semiconductor region extending vertically from a first region of a substrate; a plurality of gate electrodes disposed on the first region of the substrate in a vertical direction, but separated from each other along a sidewall of the semiconductor region; a gate dielectric layer disposed between the semiconductor region and the plurality of gate electrodes; a substrate contact electrode extending vertically from the impurity-doped second region of the substrate; and an insulating region formed as an air gap between the substrate contact electrode and at least one of the plurality of gate electrodes.

15 Claims, 22 Drawing Sheets

VERTICAL STRUCTURE SEMICONDUCTOR MEMORY DEVICES AND METHODS OF MANUFACTURING THE SAME

CROSS-REFERENCE TO RELATED APPLICATION(S)

This application is a divisional application of U.S. application Ser. No. 13/081,776, filed Apr. 7, 2011, which claims priority under 35 U.S.C. §119 to Korean Patent Application No. 10-2010-0053600, filed on Jun. 7, 2010, in the Korean Intellectual Property Office. The entire contents of each of the above-referenced applications are incorporated by reference incorporated herein by reference.

BACKGROUND

1. Field

Example embodiments of inventive concepts relate to semiconductor devices, for example, semiconductor memory devices in which memory cells are arranged vertically.

2. Description of the Conventional Art

Electronic appliances are becoming increasingly smaller in size, while data throughput requirements increase. Therefore, semiconductor memory devices for electronic appliances generally require higher integration densities.

SUMMARY

Example embodiments of inventive concepts provide vertical structure semiconductor memory devices capable of increasing the dielectric breakdown voltage between an electrode coupled to an impurity region and transistors disposed on one another in a vertical direction. Example embodiments of inventive concepts also reduce a parasitic capacitance.

At least one example embodiment provides a semiconductor memory device including: a semiconductor region extending vertically from a first region of a substrate; a plurality of gate electrodes disposed on the first region of the substrate in a vertical direction; a gate dielectric layer disposed between the semiconductor region and the plurality of gate electrodes; a substrate contact electrode extending vertically from an impurity-doped second region of the substrate; and an insulating region formed as an air gap between the substrate contact electrode and at least one of the plurality of gate electrodes. The plurality of gate electrodes are separated from one other and disposed along a sidewall of the semiconductor region.

According to at least some example embodiments, the semiconductor region, the plurality of gate electrodes, and the gate dielectric layer may form a memory cell string including selection transistors and memory cell transistors disposed between the selection transistors. The substrate may have the same conductivity type as impurities of the impurity-doped second region. Data stored in the memory cell transistors may be erased by applying an erasing voltage to the substrate via the substrate contact electrode.

The substrate may have a conductivity type opposite to that of impurities of the impurity-doped second region, and the impurity-doped second region may correspond to a source region of a transistor including a lowermost gate electrode from among the plurality of gate electrodes.

The semiconductor memory device may further include: a spacer between the substrate contact electrode and at least one of the plurality of gate electrodes. The at least one of the plurality of gate electrodes may be a gate electrode of a ground selection transistor of a memory cell string. The gate dielectric layer may include a tunneling insulating layer, a charge storage layer and a barrier insulating layer that are sequentially stacked on the semiconductor region. The tunneling insulating layer, the charge storage layer and the barrier insulating layer may be stacked in a direction toward the plurality of gate electrodes. The spacer may be formed of a material having an etch selectivity with respect to the barrier insulating layer.

According to at least some example embodiments, the insulating region may insulate the sidewalls of the substrate contact electrode from the plurality of gate electrodes. The substrate contact electrode may extend from the substrate to a height greater than that of an uppermost gate electrode from among the plurality of gate electrodes. Alternatively, the substrate contact electrode may extend from the substrate to a height less than the height of one of the gate electrodes forming a lowermost memory cell transistor from among memory cell transistors of a memory cell string.

The semiconductor memory device may further include an insulating pillar extending vertically from the first region of the substrate. Sidewalls and an upper surface of the insulating pillar may be covered by the semiconductor region.

According to at least some example embodiments, the gate dielectric layer may include a tunneling insulating layer, a charge storage layer and a barrier insulating layer that are sequentially stacked on the semiconductor region. The tunneling insulating layer, the charge storage layer and the barrier insulating layer may be stacked in a direction toward the gate electrodes. The gate dielectric layer may be disposed to extend vertically from the substrate along the sidewall of the semiconductor region. The gate dielectric layer may be disposed to cover upper and lower surfaces of the gate electrodes. The gate dielectric layer may be disposed between a lowermost gate electrode from among the plurality of gate electrodes and the substrate. A region of the substrate between the semiconductor region and the second region may serve as a channel of a transistor including the lowermost gate electrode. Edge regions of the second region of the substrate may have a height greater than that of a lower surface of the substrate contact electrode.

At least one other example embodiment provides a semiconductor memory device including: a substrate extending in a first direction and a second direction substantially perpendicular to the first direction; pillar-shaped semiconductor regions extending from the substrate in a third direction substantially perpendicular to the first direction and the second direction, the semiconductor regions being separated from each other in the first direction and in the second direction; a plurality of memory cell strings extending in the third direction along the sidewalls of the semiconductor regions; at least one impurity region defined in the substrate between the memory cell strings and extending in the second direction; at least one substrate contact electrode respectively coupled to the at least one impurity region in the substrate; and a plurality of insulating regions formed as air gaps between the at least one substrate contact electrode and the memory cell strings.

According to at least some example embodiments, the at least one substrate contact electrode may extend in a line pattern in the second direction along the at least one impurity region. The at least one substrate contact electrode may be disposed on the at least one impurity region, may be separated from each other in the second direction, and may have a pillar-shape extending in the third direction.

At least one other example embodiment provides a semiconductor memory device including: a memory cell string extending vertically from a first region of a substrate; a substrate contact electrode disposed on a second region of the substrate; and an insulating region formed as an air gap between the memory cell string and the substrate contact electrode.

At least one other example embodiment provides a semiconductor memory device having a three-dimensional structure. According to at least this example embodiment, the semiconductor memory device includes: at least one memory cell string disposed on a first region of a surface of a substrate and extending in a first direction, the first direction being substantially perpendicular to the surface of the substrate; and at least one substrate contact electrode disposed on a second region of the substrate and extending in the first direction. The substrate contact electrode is insulated from the at least one memory cell string by an air gap.

The at least one memory cell string may include: at least one string selection transistor, a plurality of memory cell transistors and at least one ground selection transistor connected serially between a bit line and a common source line. A gate electrode of at least one of the at least one string selection transistor, the plurality of memory cell transistors and the at least one ground selection transistor may be insulated from the substrate contact electrode by the air gap.

According to at least some example embodiments, gate electrodes of each of the at least one string selection transistor, the plurality of memory cell transistors and the at least one ground selection transistor may be insulated from the substrate contact electrode by the air gap.

According to at least some example embodiments, the semiconductor memory device may further include: a spacer formed between the substrate contact electrode and a gate electrode of at least one other of the at least one string selection transistor, the plurality of memory cell transistors and the at least one ground selection transistor.

According to at least some example embodiments, gate electrodes of the at least one string selection transistor, the plurality of memory cell transistors and the at least one ground selection transistor may be insulated from one another by air gaps.

According to at least some example embodiments, the at least one substrate contact electrode may include a plurality of substrate contact electrodes, each of which are insulated from the at least one memory cell string by an air gap. The plurality of substrate contact electrodes may also be insulated from one another by air gaps.

According to at least some example embodiments, a height of the at least one substrate contact electrode may be less than a height of the at least one memory cell string.

According to at least some example embodiments, the at least one memory cell string may be insulated from another memory cell string by an air gap.

At least one other example embodiment provides a memory device including: a NAND cell array including at least one semiconductor memory device; and a core circuit unit configured to communicate with the NAND cell array. In one example, the semiconductor memory device includes: at least one memory cell string disposed on a first region of a surface of a substrate and extending in a first direction, the first direction being substantially perpendicular to the surface of the substrate; and at least one substrate contact electrode disposed on a second region of the substrate and extending in the first direction. The core circuit includes: a row decoder configured to communicate with the NAND cell array via a plurality of string selection lines, a plurality of word lines, and a plurality of ground selection lines; a column decoder configured to communicate with the NAND cell array via a plurality of bit lines; a sense amplifier configured to communicate with the column decoder; and a control logic unit configured to communicate with the row decoder and the column decoder.

At least one other example embodiment provides a memory card including: a memory unit including at least one semiconductor memory device; and a controller configured to exchange electrical signals with the memory unit. In one example, the semiconductor memory device includes: at least one memory cell string disposed on a first region of a surface of a substrate and extending in a first direction, the first direction being substantially perpendicular to the surface of the substrate; and at least one substrate contact electrode disposed on a second region of the substrate and extending in the first direction.

At least one other example embodiment provides an electronic system including: a processor configured to control the electronic system; an input/output unit configured to input data to or output data from the electronic system; and a memory unit configured to store at least one of code and data for operating the processor. The memory unit includes at least one semiconductor memory device. In this example, the semiconductor memory device includes: at least one memory cell string disposed on a first region of a surface of a substrate and extending in a first direction, the first direction being substantially perpendicular to the surface of the substrate; and at least one substrate contact electrode disposed on a second region of the substrate and extending in the first direction. The processor, the input/output unit and the memory unit are coupled to one another via a bus.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
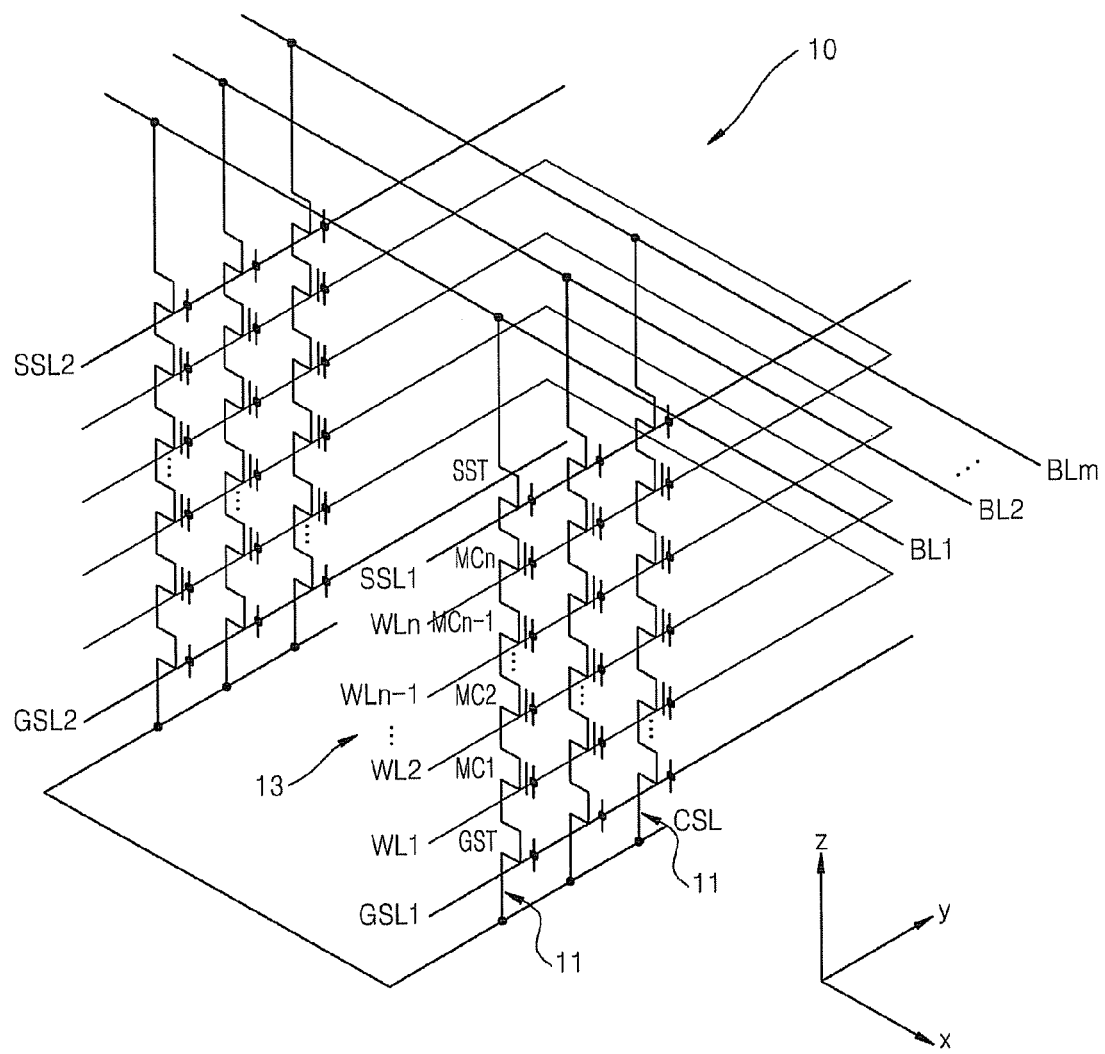
FIG. 1 is an equivalent circuit diagram of a memory cell array of a semiconductor memory device according to an example embodiment.

Example embodiments will now be described more fully with reference to the accompanying drawings to clarify aspects, features and advantages of the inventive concept. Example embodiments may, however, be embodied in many different forms and should not be construed as limited to the example embodiments set forth herein. Rather, the example embodiments are provided so that this disclosure will be thorough and complete, and will fully convey the scope of this disclosure to those of ordinary skill in the art.

It will be understood that when an element, layer or region is referred to as being "on" another element, layer or region, the element, layer or region can be directly on another element, layer or region or intervening elements, layers or regions. In contrast, when an element is referred to as being "directly on" another element, layer or region, there are no intervening elements, layers or regions present. In the drawings, lengths and sizes of layers and regions may be exaggerated for clarity. Like reference numerals refer to like elements throughout. As used herein, the term "and/or" includes any and all combinations of one or more of the associated listed items.

The terms used herein are for the purpose of describing particular embodiments only and are not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, layers, regions, elements, components, and/or groups thereof, but do not preclude the presence or addition of one or more other features, integers, steps, operations, layers, regions, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

FIG. 1 is an equivalent circuit diagram of a memory cell array 10 of a semiconductor memory device according to an example embodiment. The memory cell device of FIG. 1 is a vertical structure NAND flash memory device having a vertical channel structure.

Referring to FIG. 1, the memory cell array 10 includes a plurality of memory cell strings 11 arranged in x-axis and y-axis directions. In the example embodiment shown in FIG. 1, each memory cell string 11 has a vertical structure extending in a direction (e.g., a z-axis direction in FIG. 1) perpendicular or substantially perpendicular to the x-axis and y-axis directions. In extending in the z-axis direction, each memory cell string 11 also extends from an upper surface of a substrate (not shown), which extends in the x-axis and y-axis directions. The plurality of memory cell strings 11 form a memory cell block 13.

Each of the plurality of memory cell strings 11 includes a string selection transistor SST, a plurality of memory cells MC1-MCn, and a ground selection transistor GST. The ground selection transistor GST, the memory cells MC1-MCn, and the string selection transistor SST of each of the memory cell strings 11 are arranged serially in a vertical direction (e.g., the z-axis direction of FIG. 1). The plurality of memory cells MC1-MCn are configured to store data. A plurality of word lines WL1-WLn are connected to the memory cells MC1-MCn, respectively, to control the memory cells MC1-MCn. The number of memory cells MC1-MCn may be varied according to the desired capacity of the semiconductor memory device.

Still referring to FIG. 1, the memory cell strings 11 are arranged in $1^{st}$-$m^{th}$ columns of the memory cell block 13. For the sake of clarity, the memory cell array 10 shown in FIG. 1 may be described with regard to one of the memory cell strings 11 shown in FIG. 1. However, it will be understood that each of the memory cell strings 11 may be configured is the same or substantially the same manner.

As shown in FIG. 1, an end of each of the memory cell strings 11 (e.g., a drain side of the string selection transistors SST) is coupled to a corresponding one of the plurality of bit lines BL1-BLm extending in the x-axis direction. The other end of each of the memory cell strings 11 (e.g., a source side of the ground selection transistors GST) is coupled to a common source line CSL.

The plurality of word lines WL1-WLn extend in the y-axis direction. As shown in FIG. 1, the plurality of word lines WL1-WLn are respectively coupled to the gates of rows of the memory cells MC1-MCn. Data may be written to, read or erased from the plurality of memory cells MC1-MCn upon activation of the word lines WL1-WLn.

Referring still to FIG. 1, each string selection transistors SST is arranged between one of bit lines BL1-BLm and a corresponding one of memory cells MCn of the memory cell strings 11. String selection lines SSL1, SSL2 are respectively coupled to gates of the string selection transistors SST to control data transfer between the bit lines BL1-BLm and the memory cells MC1-MCn.

Each ground selection transistor GST is arranged between the common source line CSL and a corresponding one of the memory cells MC1. Ground selection lines GSL1, GSL2 are respectively coupled to gates of the ground selection transistors GST to control data transfer between the common source line CSL and the memory cells MC1-MCn.

Figure 2:
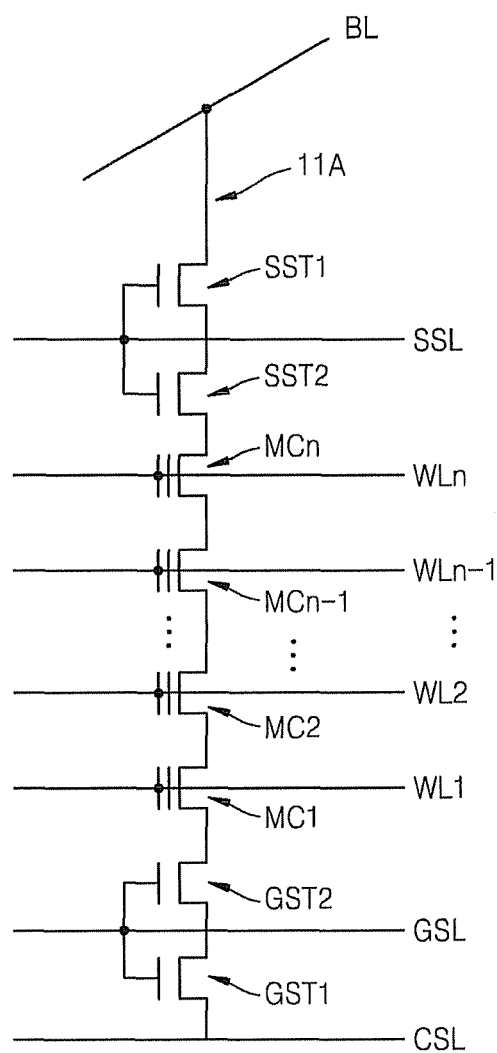
FIG. 2 is an equivalent circuit diagram of a string of memory cells according to another example embodiment.

FIG. 2 is an equivalent circuit diagram of a memory cell string of a semiconductor memory device according to another example embodiment. In more detail, FIG. 2 is an equivalent circuit diagram of a memory cell string 11A of a NAND flash memory device having a vertical channel structure. In FIG. 2, reference numerals like those used in FIG. 1 denote like elements. Thus, in order to avoid redundancy, detailed descriptions of those elements are not provided.

In FIG. 1, each memory cell strings 11 include a string selection transistor SST including a single transistor. However, the memory cell string 11A shown in FIG. 2 includes a pair of string selection transistors SST1 and SST2 arranged serially between a bit line BL and memory cell MCn. The gate of each string selection transistor SST1 and SST2 is coupled to a string selection line SSL. The string selection line SSL corresponds to the first string selection line SSL1 or the second string selection line SSL2 shown in FIG. 1.

Similarly, the memory cell strings 11 in FIG. 1 have a ground selection transistor GST including a single transistor. However, the memory cell string 11A shown in FIG. 2 has a pair of ground selection transistors GST1 and GST2 arranged serially between the common source line CSL and the memory cell MC1. The gate of each ground selection transistor GST1 and GST2 is coupled to a ground selection line GSL. The ground selection line GSL corresponds to the first ground selection line GSL1 or the second ground selection line GSL2 of FIG. 1.

The bit line BL of FIG. 2 corresponds to one of the bit lines BL1-BLm of FIG. 1.

Figure 3:
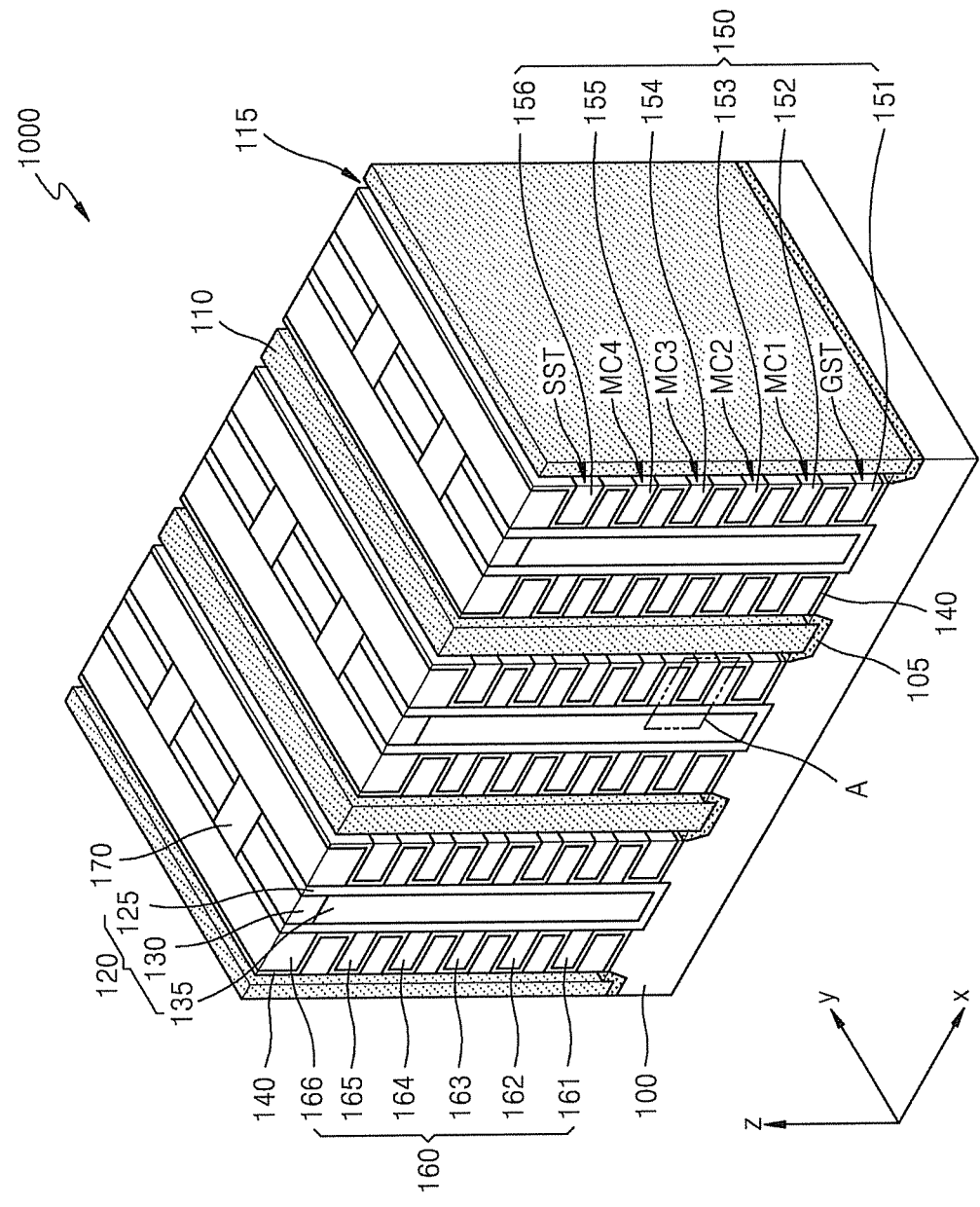
FIG. 3 is a schematic perspective view of a 3-dimensional (3D) structure of a semiconductor memory device according to an example embodiment.

FIG. 3 is a schematic perspective view of a 3-dimensionally (3D) structured semiconductor memory device 1000 including memory cell strings according to an example embodiment. Some of the components of the memory cell strings of FIG. 1 or 2 are not illustrated in FIG. 3. For example, the bit lines shown in FIG. 1 or 2 are not shown in FIG. 3. In FIG. 3, the view in the y-axis direction is a section taken along the bit lines of, for example, FIG. 1 or 2, and the view in the x-axis direction is a section taken along the word lines of, for example, FIG. 1 or 2. Thus, in FIG. 3, a substrate contact electrode is exposed. The view in the z-axis direction is a section taken so as to show the arrangement of semiconductor regions underlying a gate dielectric layer (not shown).

Referring to FIG. 3, the semiconductor memory device 1000 includes a substrate 100 whose upper surface extends in x-axis and y-axis directions. The substrate 100 includes a semiconductor material such as a Group IV semiconductor, a Group III-V compound semiconductor, or a Group II-VI oxide semiconductor. Examples of the Group IV semiconductor include silicon, germanium, silicon-germanium and the like. The substrate 100 may be, for example, a bulk wafer or an epitaxial layer.

A plurality of impurity regions 105 extending in the y-axis direction are formed in the substrate 100. The plurality of impurity regions 105 are separated from one another in the x-axis direction and are formed adjacent to (or at) the upper surface of the substrate 100. The impurity regions 105 may have the same or a different conductivity type than that of the substrate 100. For example, if the substrate 100 is a p-type substrate, the impurity regions 105 may have n-type or p-type conductivity. If the impurity regions 105 have the same conductivity type as that of the substrate 100, the impurity regions 105 may be arranged in a manner different from that illustrated in FIG. 3. The impurity regions 105 may include a more heavily-doped impurity region (not shown) in a center or central region of the substrate 100 adjacent to the upper surface of the substrate 100, and more lightly-doped impurity regions (not shown) disposed at each side of the more heavily-doped impurity region.

Still referring to FIG. 3, semiconductor regions 120 in the form of pillars are disposed between the impurity regions 105 on the substrate 100. The semiconductor regions 120 extend in the z-axis direction. The semiconductor regions 120 are arranged in a matrix, separated from one another both in the x-axis and y-axis directions.

FIG. 3 illustrates nine semiconductor regions 120, three of which are arranged in the x-axis direction and three of which are arranged in the y-axis direction. However, the number of semiconductor regions 120 in FIG. 3 is limited for illustrative purposes only. The number and layout of semiconductor regions 120 according to example embodiments are not limited to the illustration in FIG. 3.

An insulating layer 170 is disposed between each pair of adjacent semiconductor regions 120 in the y-axis direction to insulate the adjacent semiconductor regions 120 from one another. In the example embodiment shown in FIG. 3, the semiconductor regions 120 are disposed to extend from below the upper surface of the substrate 100 in the z-axis direction.

Each semiconductor region 120 includes an insulating pillar 135 extending in the z-axis direction, and a semiconductor layer 125 covering the bottom and x-axis directional sidewalls of the insulating pillar 135. The semiconductor layer 125 may directly or indirectly contact the substrate 100. But, in the example embodiment shown in FIG. 3, the semiconductor layer 125 directly contacts the substrate 100. The y-axis directional sidewalls of the insulating pillar 135 contact the insulating layer 170. In one example, the insulating pillar 135 may include Undoped Silica Glass (USG), Spin On Glass (SOG), Tonen SilaZene (TOSZ) or the like. The semiconductor layer 125 may include an up-doped polysilicon layer or an up-doped monocrystalline silicon layer.

Still referring to FIG. 3, the semiconductor region 120 also includes a conductive layer 130. The conductive layer 130 covers an upper surface of the insulating pillar 135 and is electrically connected to upper regions of the semiconductor layer 125. In one example, the conductive layer 130 may be a doped polysilicon layer and may function as a drain region of the selection transistor SST.

In alternative example embodiments, the semiconductor regions 120 may include only semiconductor pillars extending in the z-axis direction. In this example, the semiconductor regions 120 may be filled with a semiconductor material, and need not include insulating pillars. The semiconductor pillars may include impurity-doped regions in the upper regions of the semiconductor pillars.

Referring back to the example embodiment shown in FIG. 3, the semiconductor regions 120 and the insulating layers 170 are arranged alternately in the y-axis direction. A plurality of memory cell strings (see, e.g., 11 in FIG. 1) are disposed on the x-axis directional sidewalls of the semiconductor regions 120 and the insulating layers 170 in the y-axis direction. FIG. 3 shows two memory cell strings extending in the z-axis direction are disposed respectively on the x-axis directional sidewalls of each of the semiconductor regions 120. Each memory cell string includes a ground selection transistor GST, a plurality of memory cells MC1-MC4, and a string selection transistor SST. The string selection transistors SST arranged in the x-axis direction are respectively coupled to the same bit line (see, e.g., FIG. 1) via the semiconductor regions 120. Although not shown in FIG. 3, the bit lines may be linear patterns extending in the x-axis direction. The bit lines are electrically connected to the conductive layers 130 of the semiconductor layers 120 via contact plugs (not shown). The ground selection transistors GST arranged in the x-axis direction are connected to adjacent impurity regions 105.

Gate electrodes 150 extending in the y-axis direction are disposed on the x-axis directional sidewalls of the semiconductor regions 120. The gate electrodes 150 are separated from one another in the z-axis direction. The gate electrodes 150 include a gate electrode 151 of the ground selection transistor GST, gate electrodes 152-155 of the memory cells MC1-MC4, and a gate electrode 156 of the string selection transistor SST. The gate electrodes 150 may be commonly used by the plurality of memory cell strings arranged in the y-axis direction. The gate electrode 156 of the string selection transistor SST may be coupled to a string selection line SSL (as shown, e.g., in FIG. 1). Gate electrodes 152-155 of respective memory cells MC1-MC4 are coupled to a corresponding one of the word lines WL1-WL4 (as shown, e.g., in FIG. 1). The gate electrode 151 of the ground selection transistor GST is coupled to a ground selection line GSL (as shown, e.g., in FIG. 1). Each gate electrode 150 may include a metal layer, such as a tungsten layer or the like. Although not illustrated, each gate electrode 150 may further include a barrier layer. In one example, the barrier layer may include at least one layer selected from the group including a WN layer, a TaN layer, a TiN layer or the like.

Although FIG. 3 illustrates, for convenience of explanation, four memory cells MC1-MC4 disposed between the string selection transistor SST and the ground selection transistor GST of each memory cell string, inventive concepts are not limited thereto. For example, each memory cell string may include a larger or smaller number of memory cells than that illustrated in FIG. 3 between the string selection transistor SST and the ground selection transistor GST. Moreover, in FIG. 3, only one string selection transistor SST and one ground selection transistor GST are disposed for each memory cell string, which is similar to the semiconductor memory device of FIG. 1. However, inventive concepts are not limited to this structure. For example, pairs of string selection transistors SST and ground selection transistors GST may be provided, similar to the string selection transistors SST1 and SST2 and the ground selection transistors GST1 and GST2 of the memory cell string of FIG. 2.

Referring still to FIG. 3, the gate electrodes 150 are separated from one another in the z-axis direction by interlayer insulating layers 160 disposed between the gate electrodes 150. The interlayer insulating layers 160 include the plurality of interlayer insulating layers 161-166. Similar to the gate electrodes 150, the interlayer insulating layers 160 are separated from one another in the z-axis direction and extend in the y-axis direction. One side of each of the interlayer insulating layers 160 contacts a corresponding semiconductor region 120. Each interlayer insulating layer 160 may include an oxide layer, a nitride layer or the like.

Gate dielectric layers 140 are disposed between the semiconductor regions 120 and the gate electrodes 150. As shown in FIG. 3, the gate dielectric layers 140 are disposed to cover upper and lower surfaces of the gate electrodes 150 and a side of the interlayer insulating layers 160 opposite to the semiconductor regions 120. The gate dielectric layers 140 are also disposed between the gate electrodes 151 of the ground selection transistors GST and the substrate 100. When the ground selection transistors GST are turned on, channels are created in the regions of the substrate 100 underlying the gate electrodes 151 so that the semiconductor regions 120 and the impurity regions 105 are electrically connected.

Although not illustrated in FIG. 3, the gate dielectric layers 140 are disposed to cover the top surfaces of the uppermost interlayer insulating layers 166 and the top surfaces of the semiconductor regions 120. Moreover, although not illustrated in FIG. 3, each gate dielectric layer 140 may include a tunneling insulating layer, a charge storage layer, and a barrier insulating layer that are stacked sequentially on the corresponding semiconductor region 120 in the stated order. The tunneling insulating layer allows for injection of charges into the charge storage layer by Fowler-Nordheim (F-N) tunneling. The charge storage layer stores charges by charge trapping. In one example, the charge storage layer may include quantum dots or nanocrystals. In this regard, the quantum dots or nanocrystals may include fine particles of a conductor, such as a metal or a semiconductor. The barrier insulating layer may include a high-k dielectric material. The high-k dielectric material may refer to a dielectric material having a dielectric constant higher than that of oxide layers. According to at least some example embodiments, the gate dielectric layer 140 may include ONA (oxide-nitride-alumina), ONOA (oxide-nitride-oxide-alumina), or the like. A detailed description in this regard will be provided with reference to FIG. 6A.

Still referring to FIG. 3, a plurality of substrate contact electrodes 110 extending in the z-axis direction are disposed in ohmic contact with respective ones of the impurity regions 105. The substrate contact electrodes 110 also extend in the y-axis direction along respective ones of the impurity regions 105. As shown in FIG. 3, the substrate contact electrodes 110 are disposed to extend in the z-axis direction from under or below the upper surface of the substrate 100. Each substrate contact electrode 110 includes at least one metal line composed of a metal selected from the group including tungsten (W), aluminum (Al), copper (Cu) and the like. Although not illustrated in FIG. 3, silicide layers may be disposed between the impurity regions 105 and the substrate contact electrodes 110 to reduce contact resistance.

If the impurity regions 105 have a conductivity type opposite to that of the substrate 100, the substrate contact electrodes 110 may be coupled to the common source line CSL (as shown, e.g., in FIG. 1). In this example, the impurity regions 105 function as source regions of the ground selection transistor GST.

On the other hand, if the impurity regions 105 have the same conductivity type as that of the substrate 100, the substrate contact electrodes 110 may be pocket p-well contact electrodes for performing erasing operations in units of memory cell blocks. In this regard, data stored in the memory cells of a corresponding memory cell block may be concurrently or simultaneously erased by applying a relatively high voltage to the substrate 100 via the pocket p-well contact electrode.

The substrate contact electrodes 110 are insulated from the gate electrodes 150 by the insulating regions 115. In the example embodiment shown in FIG. 3, the insulating regions 115 are air gaps. Because the dielectric constant of air is less than the dielectric constant of other insulating materials, the parasitic capacitance between the substrate contact electrode 110 and the gate electrodes 150 may be reduced. In addition, the dielectric breakdown voltage between the substrate contact electrodes 110 and the gate electrodes 150 may increase. Thus, the semiconductor memory device 1000 may operate with improved reliability relative to conventional semiconductor devices.

Regions of the impurity regions 105 exposed by the air gaps of the insulating regions 115 may be more lightly-doped impurity regions, whereas regions of the impurity regions 105 contacting the substrate contact electrodes 110 may be more heavily-doped impurity regions.

FIG. 4A through 4D are schematic perspective views illustrating 3D structures of semiconductor memory devices each including memory cell strings according to other example embodiments. In FIG. 4A to FIG. 4D, reference numerals like those used in FIG. 3 denote like elements. Thus, in order to avoid redundancy, detailed descriptions of those elements are not provided.

Figure 4A:
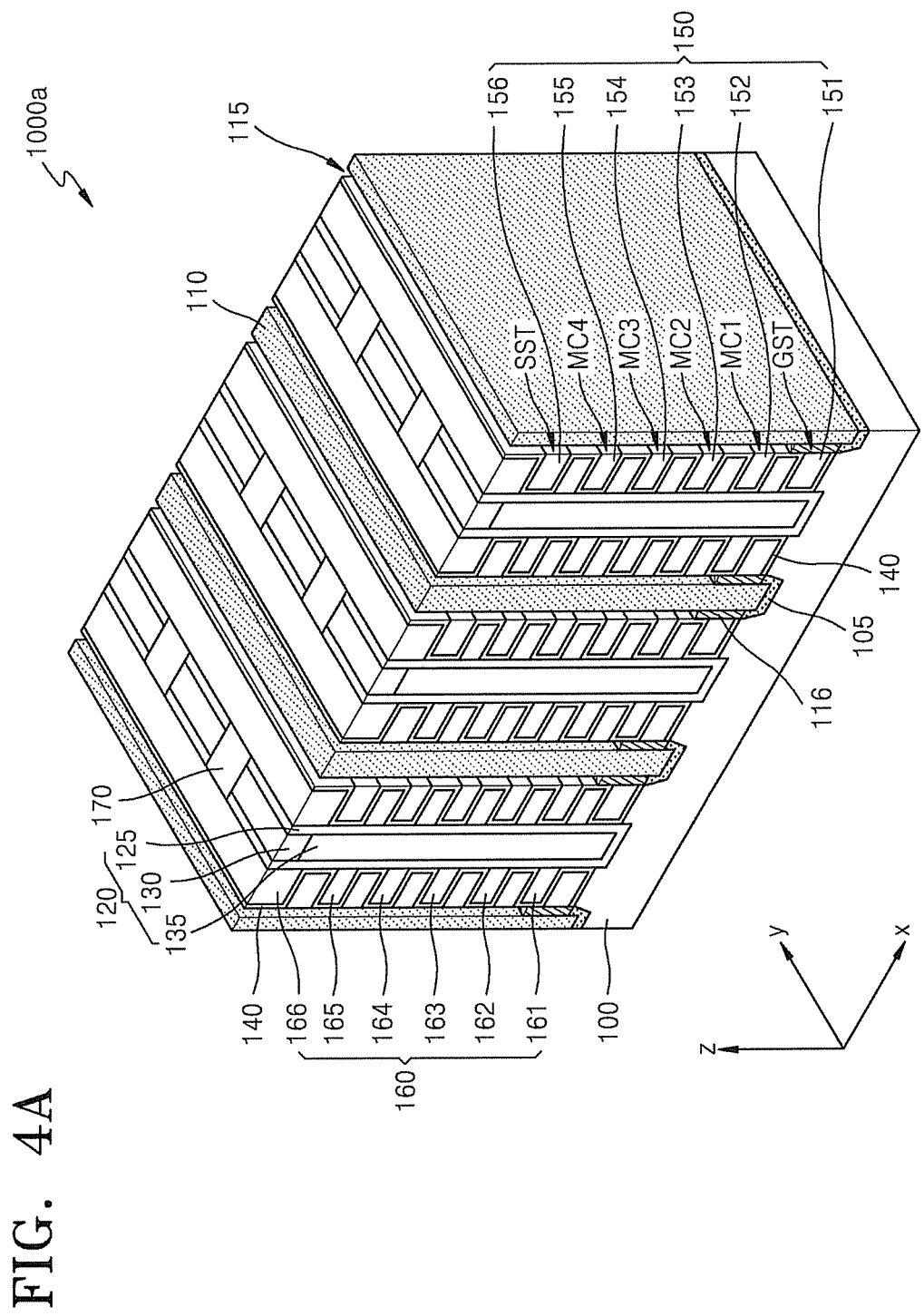
FIGS. 4A through 4D are schematic perspective views illustrating 3D structures of semiconductor memory devices according to other example embodiments.

Referring to FIG. 4A, spacers 116 are disposed in the insulating regions 115, which are formed as air gaps. The spacers 116 are disposed on the upper surface of the substrate 100 between the substrate contact electrodes 110 and a portion of the memory cell strings. The spacers 116 extend in the y-axis direction. According to at least some example embodiments, the spacers 116 may be disposed between the substrate contact electrodes 110 and the string selection transistors SST and/or the ground selection transistor GST. Each spacer 116 may include an oxide layer, a nitride layer, an oxynitride layer, a composite layer thereof or the like.

In the example embodiment shown in FIG. 4A, the spacers 116 are disposed in spaces between the substrate contact electrodes 110 and the ground selection transistors GST of the memory cell strings. The spacers 116 extend from the upper surface of the substrate 100 in the z-axis direction to a height or level higher than, equal, or substantially equal to the height to which the ground selection transistors GST extends. Because a relatively low voltage is applied to the ground selection transistors GST relative to the memory cells MC1-MC4, the substrate contact electrodes 110 may be less affected by capacitive coupling in the ground selection transistors GST than in the memory cells MC1-MC4. Thus, although the spacers 116 are disposed between some portions of the memory cell strings and the substrate contact electrodes 110, the reliability of the semiconductor memory device 1000a is maintained. The spacers 116 may more stably support the substrate contact electrodes 110 such that the substrate contact electrodes 110 do not to lean toward the x-axis direction.

Figure 4B:
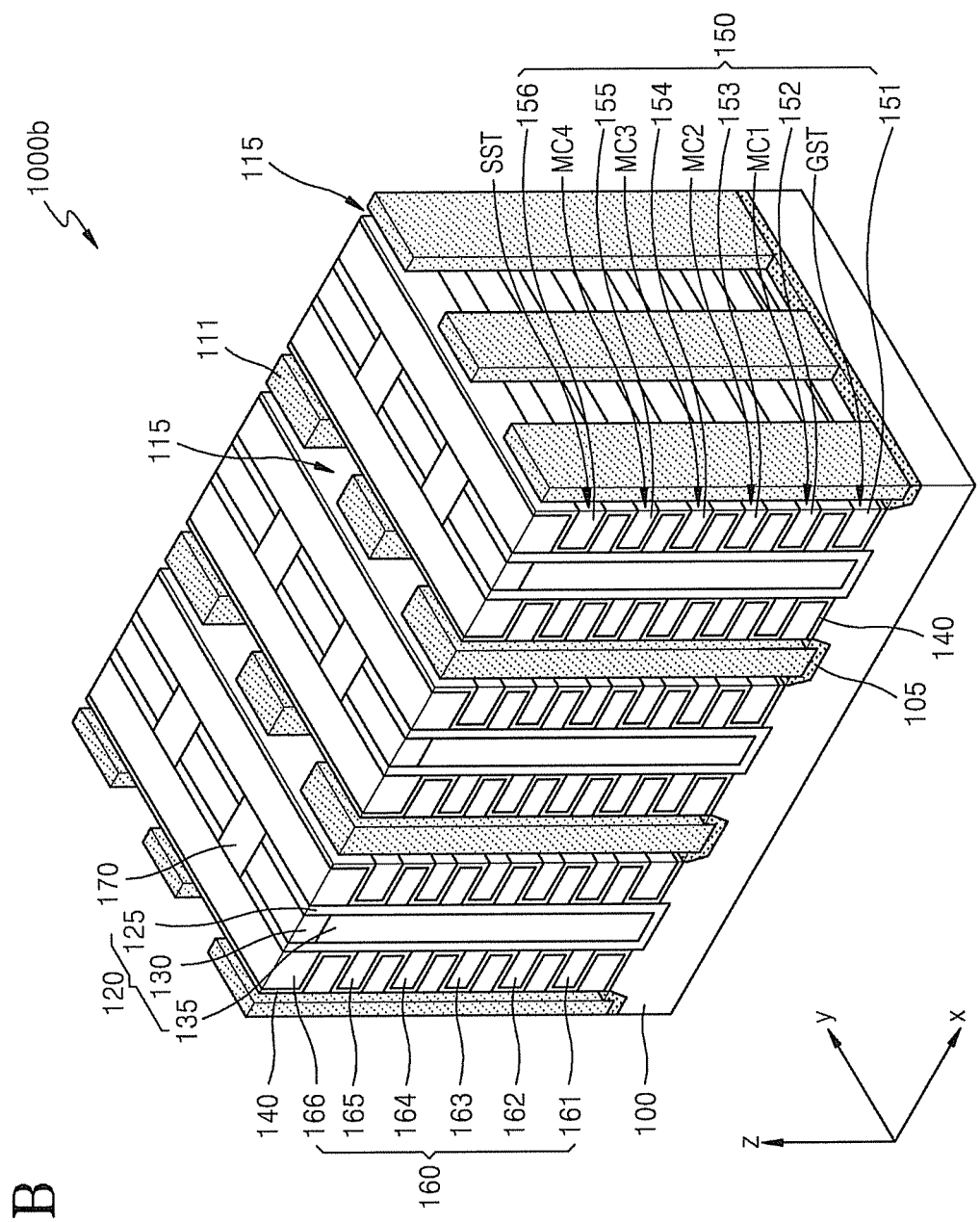

Referring to FIG. 4B, a plurality of substrate contact electrodes 111 in the form of pillars are disposed on each impurity region 105. In addition to being insulated from the gate electrodes 150 by the insulating regions 115, the substrate contact electrodes 110 are separated and insulated from one another in the y-axis direction by the insulating regions 115. In this example, the insulating regions 115 are formed as air gaps. The number of substrate contact electrodes 111 is not limited to the number shown in the example embodiment illustrated in FIG. 4B.

Due to their pillar form, the substrate contact electrodes 111 may be less affected by the memory cell strings. Although the substrate contact electrodes 111 shown in FIG. 4B have rectangular cross sections, inventive concepts are not limited to this shape. For example, the substrate contact electrodes 111 may have circular, elliptical or similar cross sections.

Figure 4C:
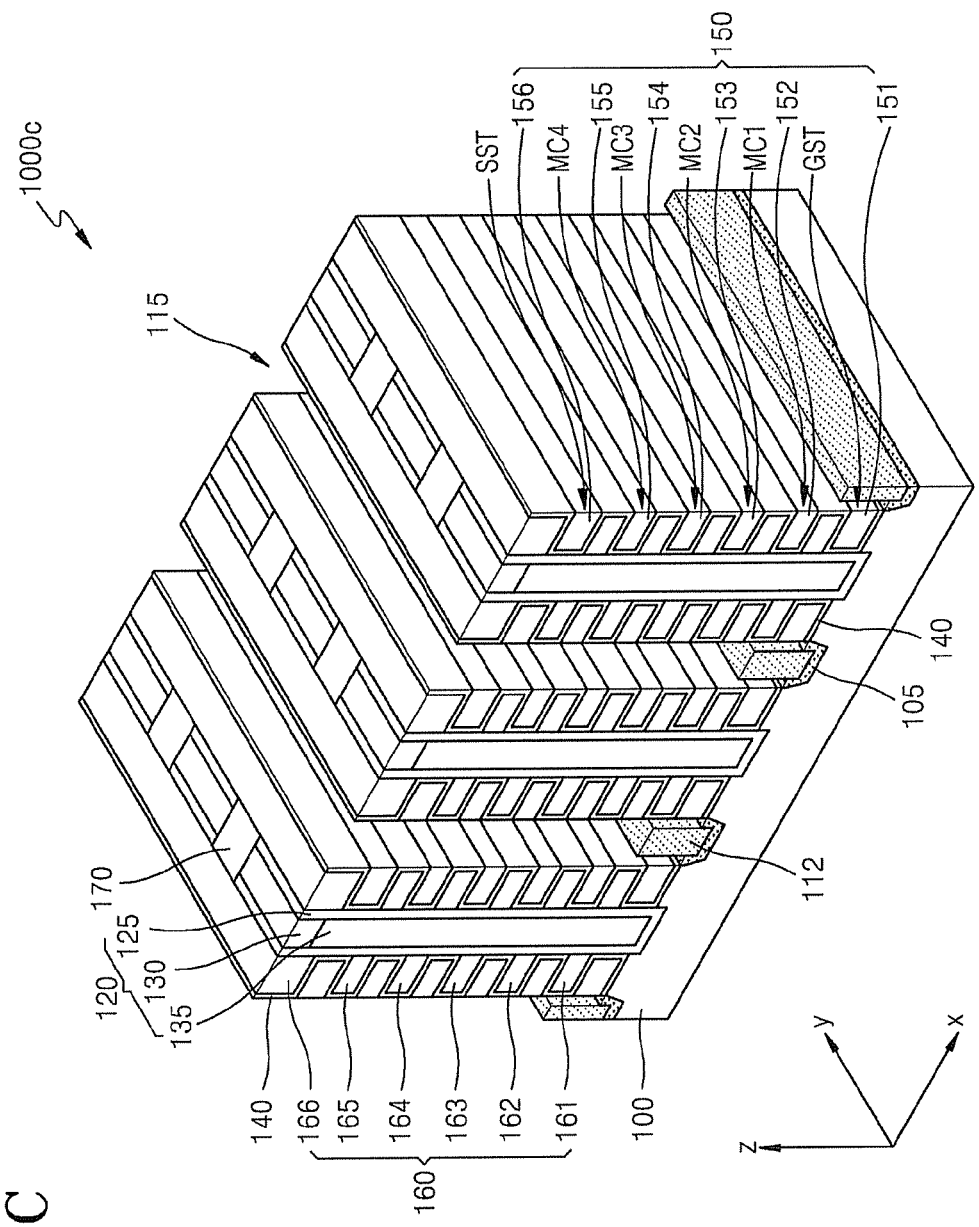

In the example embodiment shown in FIG. 4C, a plurality of substrate contact electrodes 112 are disposed on the impurity regions 105 in the form of lines. The plurality of substrate contact electrodes 112 extend in the y-axis direction. The disposition of the substrate contact electrodes 112 on the impurity regions 105 may reduce the relatively high electric resistance of the impurity regions 105 to be lower than when the impurity regions 105 exist by themselves. The substrate contact electrodes 112 have a height equal or substantially equal to that of the ground selection transistors GST to which a relatively low voltage is applied. Thus, the substrate contact electrodes 112 may be less affected electrically by the memory cells MC1-MC4.

The substrate contact electrodes 112 are insulated from the gate electrodes 150 by insulating regions 115. In this example, the insulating regions 115 are formed as air gaps. Additionally, unlike the example embodiment shown in FIG. 3, the gate electrodes 150 above the gate electrode 151 of the ground selection transistor GST are insulated from one another by the insulating regions 115, which are formed as air gaps. Despite the inclusion of insulating regions 115 in the form of air gaps, the semiconductor memory device 1000c may be structurally stable due to the reduced height of the substrate contact electrodes 112.

Figure 4D:
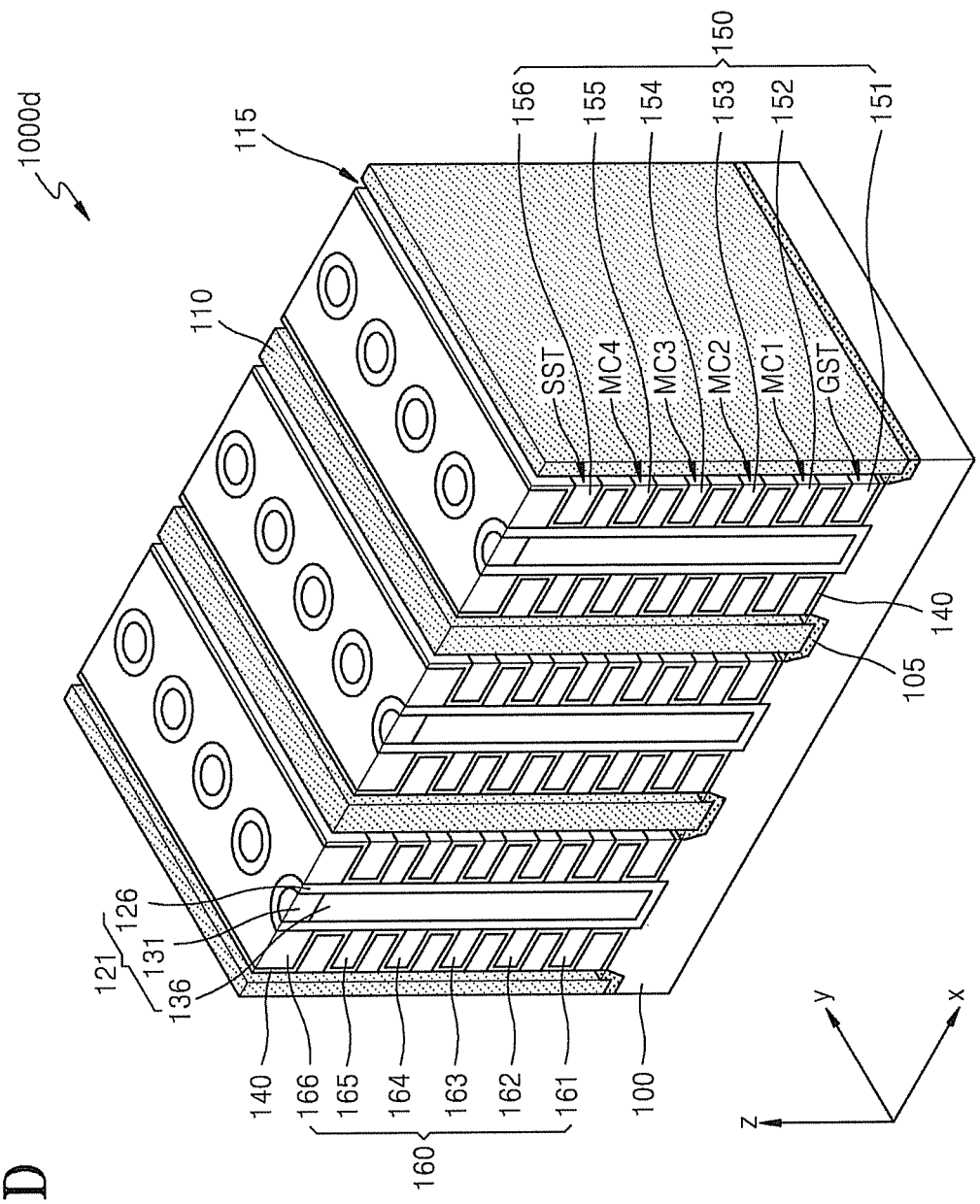

Referring to FIG. 4D, the semiconductor regions 120 of FIG. 3 are replaced by cylindrical semiconductor regions 121.

The cylindrical semiconductor regions 121 extend from the upper surface of the substrate 100 in the z-axis direction, and are arranged in a matrix array. The cylindrical semiconductor regions 121 are separated from one another both in the x-axis and y-axis directions. Semiconductor layers 126 are disposed to respectively surround the cylindrical semiconductor regions 121. In FIG. 4D, the semiconductor layers 126 have a cylindrical annular shape and are at least partially filled with insulating pillars 136. Conductive layers 131 are disposed in upper regions of the insulating pillars 136, and are connected to the semiconductor layers 126.

As in the semiconductor memory device 1000 of FIG. 3, the substrate contact electrodes 110 in the semiconductor memory device 1000d of FIG. 4D are separated and insulated from the memory cell strings by insulating regions 115, which are in the form of air gaps. In the example embodiment illustrated in FIG. 4D, a memory cell string extends along each semiconductor region 121 in the z-axis direction.

The features of the example embodiments illustrated in FIGS. 4A through 4D may be used separately or in combination with one another to implement other example embodiments of semiconductor memory devices according to inventive concepts.

Figure 5:
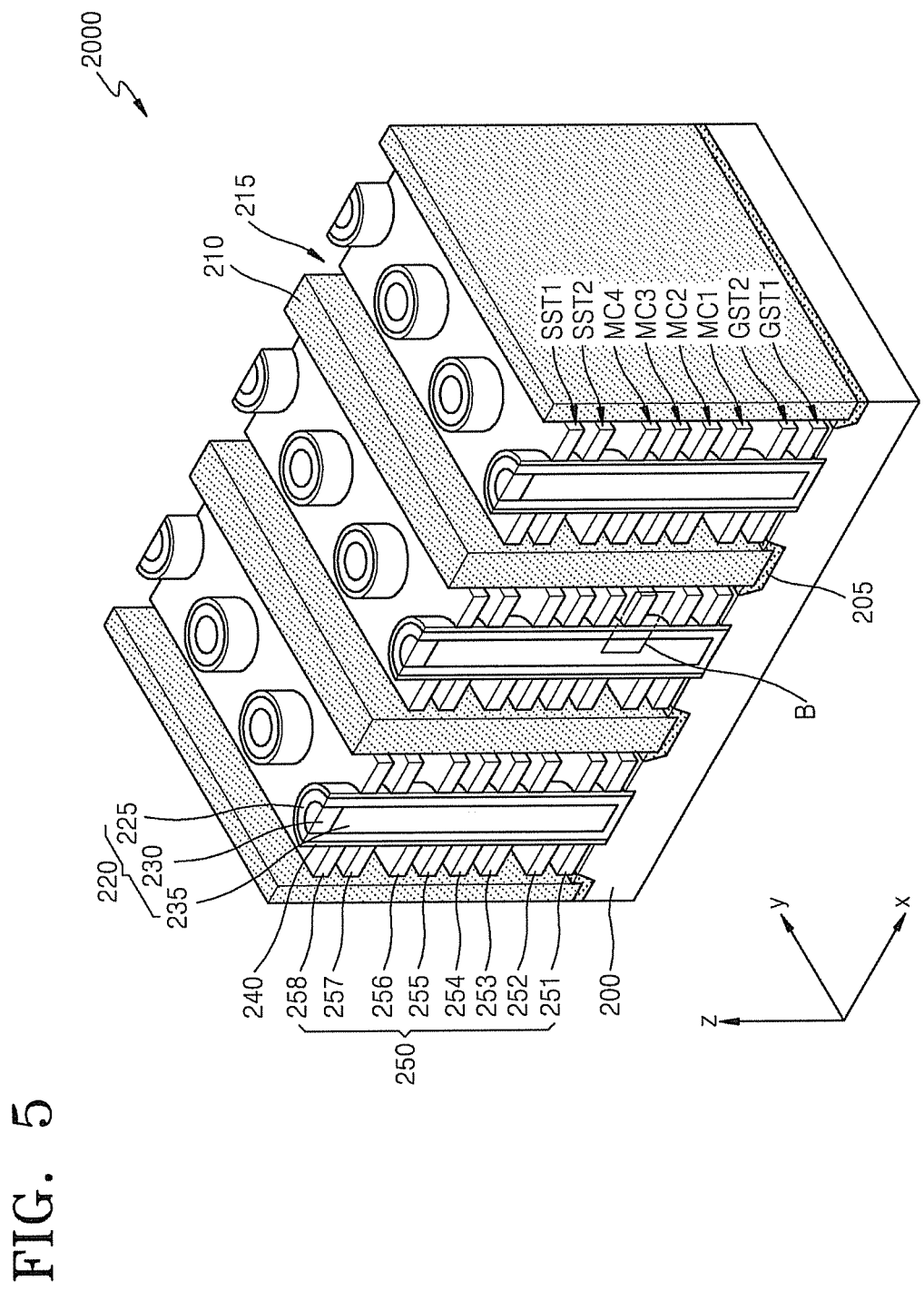
FIG. 5 is a schematic perspective view illustrating a 3D structure of a semiconductor memory device according to yet another example embodiment.

FIG. 5 is a schematic perspective view illustrating a 3D structure of a semiconductor memory device 2000 including memory cell strings, according to yet another example embodiment. In FIG. 5, reference numerals like those used in FIG. 3 denote like elements. Thus, in order to avoid redundancy, detailed descriptions of those elements are not provided.

As in FIG. 3, some of the components of the memory cell strings of FIG. 1 are not illustrated in FIG. 5. In FIG. 5, the view in the y-axis direction is a section taken along the bit lines of FIG. 1, and the view in the x-axis direction is a section taken along the word lines of FIG. 1. Thus, in FIG. 5 a substrate contact electrode is exposed. The view in the z-axis direction is a section taken so as to show the arrangement of semiconductor regions underlying an etch-stop layer (not shown).

Referring to FIG. 5, the semiconductor memory device 2000 includes a substrate 200 having an upper surface extending in the x-axis and y-axis directions. Impurity regions 205 extending in the y-axis direction are disposed adjacent to (or at) the upper surface of the substrate 200. The impurity regions 205 are separated from one another in the x-axis direction. The substrate 200 and the impurity regions 205 of FIG. 5 correspond to the substrate 100 and the impurity regions 105 of example embodiment illustrated in FIG. 3, respectively.

Semiconductor regions 220 in the form of pillars extending in the z-axis direction are disposed between the impurity regions 205 on the substrate 200. The semiconductor regions 220 are separated from one another both in the x-axis and y-axis directions. The semiconductor regions 220 are disposed to contact the upper surface of the substrate 200 and extend from under (e.g., a level lower than) the upper surface of the substrate 200 in the z-axis direction.

Each semiconductor region 220 includes a semiconductor layer 225 covering the outer surfaces and bottoms of the semiconductor region 220. As shown in FIG. 5, the semiconductor layers 225 may have a cylindrical annular shape. Each semiconductor region 220 further includes an insulating pillar 235 at least partially filling the annular semiconductor layer 225. Each semiconductor region 220 also includes a conductive layer 230 covering the upper surface of the insulating pillar 235 and which is electrically connected to the upper region of the semiconductor layer 225. The semiconductor layers 225 may directly or indirectly contact the substrate 200 in lower regions. In FIG. 5, the semiconductor layers 225 directly contact the substrate 200.

In an alternative example embodiment, the semiconductor regions 220 may include only cylindrical semiconductor pillars (not shown) formed of a semiconductor material and conductive layers disposed in the upper regions of the cylindrical semiconductor pillars. In this example, the semiconductor regions need not include the insulating pillars 235.

Still referring to FIG. 5, memory cell strings having the same structure as the memory cell string 11A of FIG. 2 are disposed along the semiconductor regions 220 extending in the z-axis direction. The memory cell strings may be arranged along the semiconductor regions 220 in a matrix formation, separated from one another both in the x-axis and y-axis directions. Unlike the structure of the example embodiment shown in FIG. 3, in the semiconductor memory device 2000 of FIG. 5 one memory cell is disposed along each semiconductor region 220. Referring to FIG. 5, each memory cell string includes two ground selection transistors GST1 and GST2, a plurality of memory cells MC1-MC4, and two string selection transistors SST1 and SST2.

A first string selection transistors SST1 of each memory cell string arranged in the x-axis direction is coupled to the same bit line (as shown, e.g., in FIG. 1) by the semiconductor regions 220. The bit lines may be linear patterns extending in the x-axis direction. The bit lines may be electrically connected to the conductive layers 230 of the semiconductor layers 220 via contact plugs (not shown). The conductive layers 230 of the semiconductor regions 220 may function as drain regions of the first string selection transistors SST1. The first ground selection transistors GST1 arranged in the x-axis direction are connected to adjacent impurity regions 205.

Gate electrodes 250 are arranged on the substrate 200 to surround the sidewalls of the semiconductor regions 220. The gate electrodes 250 are separated from one another in the x-axis direction. The gate electrodes 250 include gates of the ground selection transistors GST1 and GST2, the plurality of memory cells MC1-MC4, and the string selection transistors SST1 and SST2. The gate electrodes 250 may be commonly used by the plurality of memory cell strings arranged in the y-axis direction.

Gate electrodes 258 and 257 of the string selection transistors SST1 and SST2 may be coupled to the corresponding string selection line SSL (as shown, e.g., in FIG. 1). Gate electrodes 253-256 of the memory cells MC1-MC4 may be respectively coupled to the word lines WL1-WL4 (as shown, e.g., in FIG. 1). Gate electrodes 251 and 252 of the ground selection transistors GST1 and GST2 may be coupled to the corresponding ground selection line GSL (as shown, e.g., in FIG. 1).

Although FIG. 5 illustrates four memory cells MC1-MC4 disposed in each memory cell string, inventive concepts are not limited thereto. For example, each memory cell string may include a larger or smaller number of memory cells. In the example embodiment shown in FIG. 5, each memory cell string includes a pair of string selection transistors SST1 and SST2 and a pair of ground selection transistors GST1 and GST2, similar to the memory cell string 11A shown in FIG. 2. However, inventive concepts are not limited to this structure. For example, each memory cell string may include only one string selection transistor SST and one ground selection transistor GST, similar to the memory cell string 11 illustrated in FIG. 1. However, even when each memory cell string includes a pair of string selection transistors SST1 and SST2 and a pair of ground selection transistor GST1 and GST2, as illustrated in FIG. 2, the string selection transistors SST1 and SST2 and ground selection transistor GST1 and GST2 may have the same or substantially the same thickness as the gates of the memory cells MC1-MC4, which may suppress void formation in the gates.

Still referring to FIG. 5, gate dielectric layers 240 are disposed to cover the sidewalls of the semiconductor regions 220. As shown, the gate dielectric layers 240 surround the outer surfaces of the semiconductor layers 225 between the gate electrodes 250 and the semiconductor layers 225. Each gate dielectric layer 240 may include a tunneling insulating layer, a charge storage layer, and a barrier insulating layer that are stacked sequentially on the corresponding semiconductor region 220 in the stated order. A detailed description of the gate dielectric layers 240 will be provided in detail later with reference to FIGS. 7A and 7B.

Still referring to FIG. 5, substrate contact electrodes 210 extending in the z-axis direction are disposed in ohmic-contact with the impurity regions 205. The substrate contact electrodes 210 also extend in the x-axis direction along the impurity regions 205. In the example embodiment shown in FIG. 5, the substrate contact electrodes 210 are disposed to extend from under or below the upper surface of the substrate 200 in the z-axis direction. Although not illustrated, silicide layers may be disposed between the impurity regions 205 and the substrate contact electrodes 210 to reduce contact resistance. If the impurity regions 205 have a conductivity type opposite to that of the substrate 200, the substrate contact electrodes 210 may be coupled to the common source line CSL (as shown, e.g., in FIG. 1), and the impurity regions 205 may function as source regions of the first ground selection transistor GST1. On the other hand, if the impurity regions 205 have the same conductivity type as that of the substrate 200, the substrate contact electrodes 210 may be pocket p-well contact electrodes for performing erasing operations in units of memory cell blocks. In this regard, data stored in the memory cells of a corresponding memory cell block may be simultaneously or concurrently erased by applying a relatively high voltage to the substrate 200 via the pocket p-well contact electrode.

The substrate contact electrodes 210 are insulated from the gate electrodes 250 by insulating regions 215. In this example embodiment, the insulating regions 215 are formed as air gaps. Adjacent gate electrodes 250 are insulated and separated from one another in the z-axis direction by interlayer insulating regions 260 (as shown, e.g., in FIGS. 7A and 7B). In this example embodiment, the interlayer insulating regions 260 are also air gaps.

In more detail, according to at least this example embodiment, the interlayer insulating regions 260 and the insulating regions 215 are empty spaces of air gaps distinguishable by their location. The interlayer insulating regions 260 are regions between the gate electrodes 250 disposed in the z-axis direction. The insulating regions 215 are regions between the gate electrodes 250 and the substrate contact electrodes 210. Because the dielectric constant of air is smaller than those of other insulating materials, the parasitic capacitance between the substrate contact electrodes 210 and the gate electrodes 250 may be reduced. In addition, the dielectric breakdown voltage between the substrate contact electrodes 210 and the gate electrodes 250 may be increased. Thus, the semiconductor memory device 2000 may operate with improved reliability relative to conventional semiconductor devices.

The example embodiment illustrated in FIG. 5 may be implemented in combination with the features of the example embodiments illustrated in FIGS. 4A to 4D.

Figure 6A:
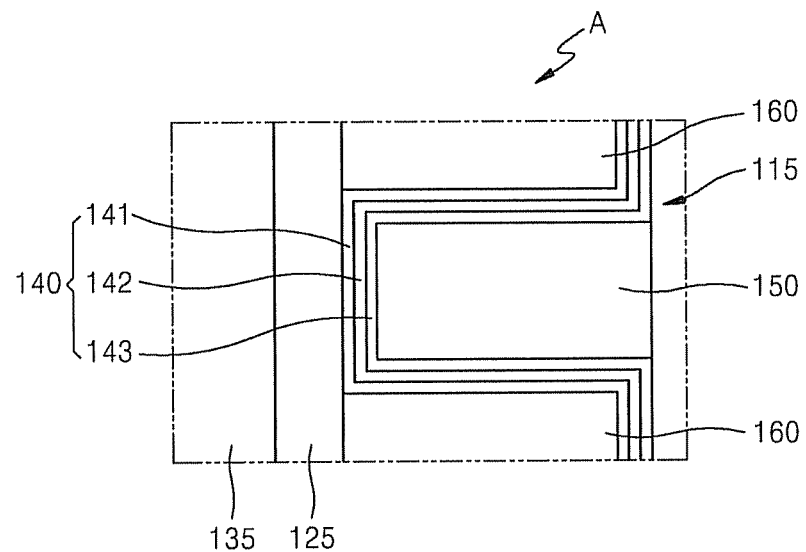
FIG. 6A is an enlarged view of a region A of FIG. 3 for describing the gate dielectric layer shown in FIG. 3 in more detail.
Figure 6B:
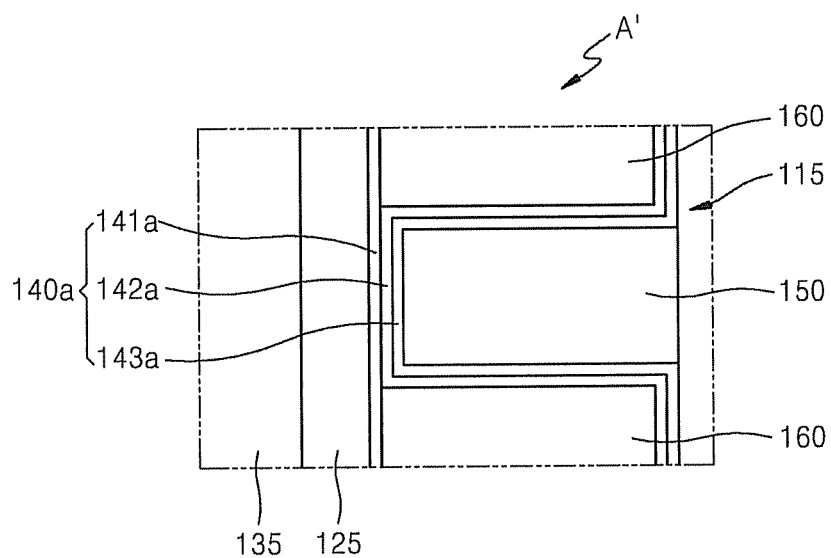
FIG. 6B is an enlarged view of another example embodiment of a gate dielectric layer.

FIG. 6A is an enlarged view of region A shown in FIG. 3 for describing the gate dielectric layer 140 in more detail. FIG. 6B is an enlarged view of another embodiment of the gate dielectric layer 140 of FIG. 3.

Referring to FIG. 6A, the semiconductor layer 125, which may be used as a channel for the transistors of the memory cell strings, is illustrated. The insulating pillar 135 is disposed on the left side of the semiconductor layer 125. A gate electrode 150 is disposed on the right side of the semiconductor layer 125. The interlayer insulating layers 160 contacting the right side of the semiconductor layer 125 are disposed above and below the gate electrode 150. The gate dielectric layer 140 is disposed to cover (e.g., continuously and/or fully cover) the right side of the interlayer insulating layer 160 on the gate electrode 150, the upper surface, the left side and lower surface of the gate electrode 150, and the right side of the interlayer insulating layer 160 under the gate electrode 150.

The gate dielectric layer 140 has a stack structure in which a tunneling insulating layer 141, a charge storage layer 142 and a barrier insulating layer 143 are stacked sequentially on the right side of the semiconductor layer 125 in the stated order.

The tunneling insulating layer 141 may be a single layer or a multi-layer structure including at least one material selected from the group including of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), zirconium oxide ($ZrO_2$), or the like.

The charge storage layer 142 may be a charge trapping layer or a floating gate conductive layer. When the charge storage layer 142 is a floating gate conductive layer, the charge storage layer 142 may be formed using chemical vapor deposition (CVD). In one example, the charge storage layer 142 may be formed by causing a $SiH_4$ or $Si_2H_6$ gas and a $PH_3$ gas to flow by using low-pressure chemical vapor deposition (LPCVD) to deposit polysilicon.

When the charge storage layer 142 is a charge trapping layer, the charge storage layer 142 may be formed as a single layer or a multi-layer structure including at least one material selected from the group including silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), aluminum gallium nitride ($AlGa_xN_y$), and the like.

The barrier insulating layer 143 may be formed as a single layer or a multi-layer structure in which each layer includes at least one material selected from the group including silicon oxide ($SiO_2$), silicon nitride ($Si_3N_4$), silicon oxynitride (SiON), a high-k dielectric material, and the like. The barrier insulating layer 143 may be formed of a higher-k dielectric material than the tunneling insulating layer 141. The higher-k dielectric material may include at least one material selected from the group including aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), praseodymium oxide ($Pr_2O_3$), and the like.

As discussed above, the insulating region 115 may be formed as an air gap on the right side of the gate electrode 150 and the barrier insulating layer 143.

Referring to FIG. 6B, a tunneling insulating layer 141a is disposed to cover (e.g., fully and/or continuously cover) the right side of the semiconductor layer 125. The interlayer insulating layers 160 are disposed to contact the right side of the tunneling insulating layer 141a. The gate electrode 150 is disposed on the right side of the tunneling insulating layer 141a and between the interlayer insulating layers 160. A charge storage layer 142a and a barrier insulating layer 143a are disposed to cover (e.g., fully and/or continuously cover) the right side of the interlayer insulating layer 160 on the gate electrode 150, the upper surface, left side and lower surface of the gate electrode 150, and the right side of the interlayer insulating layer 160 under the gate electrode 150.

The tunneling insulating layer 141a, the charge storage layer 142a and the barrier insulating layer 143a in FIG. 6B substantially correspond to the tunneling insulating layer 141, the charge storage layer 142, and the barrier insulating layer 143 in FIG. 6A, respectively.

The terms "right" and "left" used above in the description of FIGS. 6A and 6B indicate the locations of those elements relative to the transistors disposed on the right side of the semiconductor regions 120. Thus, these terms should be used reversely with respect to the transistors of the memory cell strings disposed on the left side of the semiconductor regions 120 of FIG. 3.

In an alternative example embodiment, the charge storage layer 142a may be disposed on the left side of the interlayer insulating layers 160 to contact (e.g., fully contact) the tunneling insulating layer 141a covering the right side of the semiconductor layer 125.

Figure 7A:
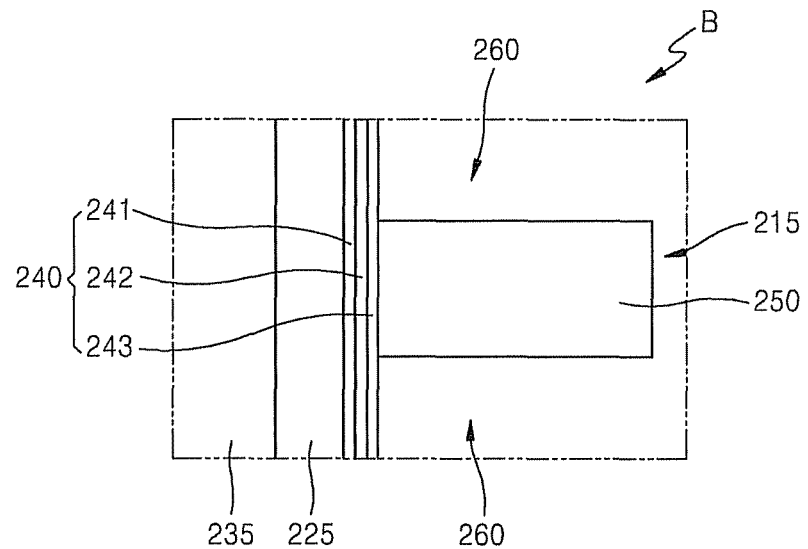
FIGS. 7A and 7B are enlarged views of a region B of FIG. 5 for describing example gate dielectric layers usable in connection with the example embodiment shown in FIG. 5.
Figure 7B:
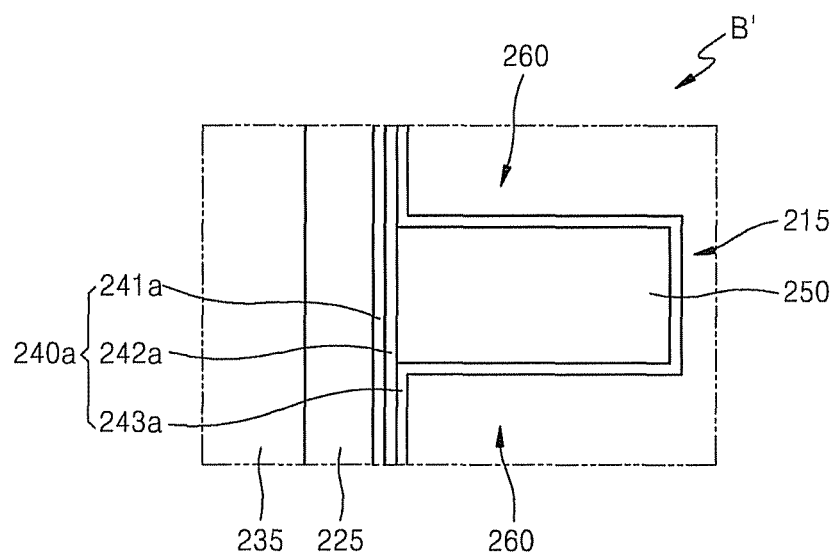

FIGS. 7A and 7B are an enlarged views of region B of FIG. 5 for describing examples of the gate dielectric layer 240 of FIG. 5 in more detail.

Referring to the region B shown in FIG. 7A, the semiconductor layer 225, which may be used as a channel for the transistors of the memory cell strings, is illustrated. The insulating pillar 235 is disposed on the left side of the semiconductor layer 225. The gate dielectric layer 240 is disposed to cover (e.g., fully and/or continuously cover) the right side of the semiconductor layer 225. The gate electrode 250 is partially disposed on the right side of the gate dielectric layer 240. Interlayer insulating regions 260, which may be air gaps, are present both above and below the gate electrode 250. And, the insulating region 215, which may be an air gap, is also present on the right side of the gate electrode 250.

The gate dielectric layer 240 has a stack structure in which a tunneling insulating layer 241, a charge storage layer 242 and a barrier insulating layer 243 are stacked sequentially on the right side of the semiconductor layer 225 in the stated order. The tunneling insulating layer 241, the charge storage layer 242, and the barrier insulating layer 243 in FIG. 7A substantially correspond to the tunneling insulating layer 141, the charge storage layer 142, and the barrier insulating layer 143, respectively.

Referring to the region B' shown in FIG. 7B, the semiconductor layer 225, which may be used as a channel for the transistors of the memory cell strings, is illustrated. The insulating pillar 235 is disposed on the left side of the semiconductor layer 225. The gate dielectric layer 240a has a stack structure in which a tunneling insulating layer 241a, a charge storage layer 242a and a barrier insulating layer 243a. The tunneling insulating layer 241a and the charge storage layer 242a are stacked in the stated order on the semiconductor layer 225. The tunneling insulating layer 241a and the charge storage layer 242a cover the semiconductor layer 225. The gate electrode 250 is disposed on a portion of the right side of the charge storage layer 242a. The barrier insulating layer 243a is formed to cover exposed portions of the charge storage layer 242a as well as the exposed surfaces of the gate electrode 250.

Interlayer insulating regions 260, which may be air gaps, are present both above and below the gate electrode 250, which is covered with the carrier insulating layer 243a. And, the insulating region 215, which may be an air gap, is also present on the right side of the gate electrode 250.

In FIGS. 7A and 7B, the terms "right" and "left" indicate the locations of those elements relative to the transistors disposed on the right side of the semiconductor regions 220. Thus, these terms should be used reversely with respect to the transistors of the memory cell strings disposed on the left side of the semiconductor regions 220 of FIG. 5.

FIGS. 8A through 8I are cross-sectional views of the semiconductor memory device 1000 of FIG. 3 in the y-axis direction, for describing a method of fabricating a semiconductor memory device.

Figure 8A:
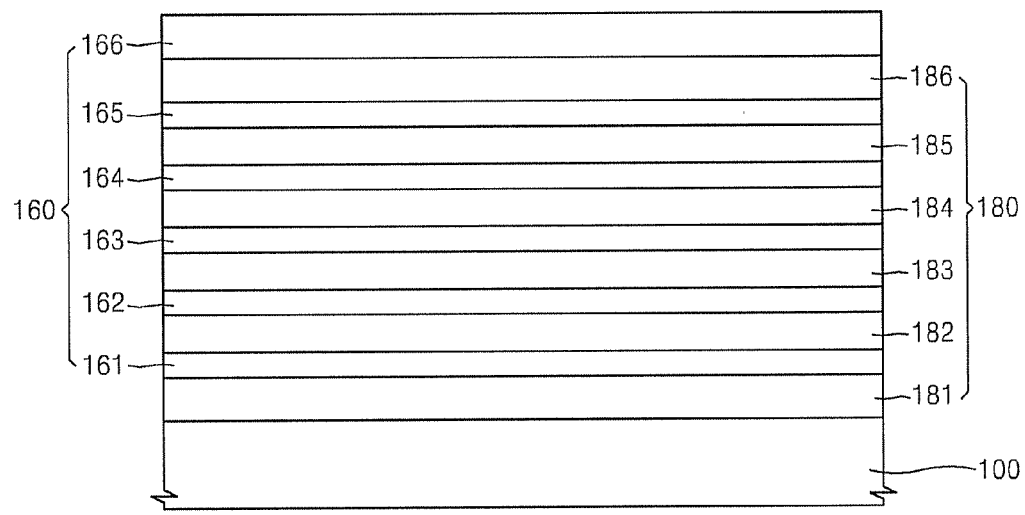
FIGS. 8A through 8L are cross-sectional views of the semiconductor memory device of FIG. 3 in a y-axis direction for describing a method of fabricating a semiconductor memory device according to an example embodiment.

Referring to FIG. 8A, sacrificial layers 180 and interlayer insulating layers 160 are alternately stacked on the substrate 100. The substrate 100 may include at least one material selected from the group including a semiconductor material, an insulating material, and a semiconductor material and a conductor material each coated with an insulating material. In one example, the substrate 100 may be a silicon wafer.

Alternatively, a lower structure (not shown) including at least one transistor may be disposed between the substrate 100, and the sacrificial layers 180 and the interlayer insulating layers 160. For convenience of explanation, an example embodiment of forming the sacrificial layers 180 and the interlayer insulating layers 160 directly on the substrate 100 will be described hereinafter for illustrative purposes. However, aspects of inventive concepts are not limited thereto.

In FIG. 8A, the interlayer insulating layers 160 include a plurality of insulating layers 161 through 166. The sacrificial layers 180 includes a plurality of sacrificial layers 181 through 186. As illustrated in FIG. 8A, the plurality of insulating layers 161 through 166 and the plurality of sacrificial layers 181 through 186 are alternately stacked on the substrate 100, beginning with the sacrificial layer 181. The sacrificial layers 180 may be formed of a material having an etch selectivity with respect to the interlayer insulation layers 160. For example, the sacrificial layers 180 may be formed of a material that is etchable so as to reduce and/or minimize the etching of the interlayer insulating layers 160 during an etching process using a given, desired or predetermined etching method. The etch selectivity may be quantified as a ratio of the etch rate of the sacrificial layers 180 to that of the interlayer insulating layers 160. The sacrificial layers 180 may be formed of a material having an etch selectivity of about 1:10 to about 1:200, inclusive, with respect to the interlayer insulating layers 160. In one example, the sacrificial layers 180 may be formed of a material having an etch selectivity of about 1:30 to about 1:100, inclusive, with respect to the interlayer insulating layers 160. According to at least one example embodiment, the interlayer insulating layers 160 may be formed of at least one type of layer selected from between a silicon oxide layer and a silicon nitride layer. The sacrificial layers 180 may be formed of a type of layer different from that of the interlayer insulating layers 160. In one example, the sacrificial layers 180 may be formed of a layer selected from the group including a silicon layer, a silicon oxide layer, a silicon carbide layer, a silicon nitride layer, and the like. For convenience of explanation, an example embodiment of forming the interlayer insulating layers 160 as silicon oxide layers, and the sacrificial layers 180 as silicon nitride layers will be described hereinafter.

As illustrated in FIG. 8A, the first sacrificial layer 181 and the sixth sacrificial layer 186 are formed to be thicker than the second to fifth sacrificial layers 182 to 185. The thicknesses of the first sacrificial layer 181 and the sixth sacrificial layer 186 may be limited by the thicknesses of the gates of the string selection transistor SST and the ground selection transistor GST, respectively, as will be described later. The first sacrificial layer 181 and the sixth sacrificial layer 186 are also formed to be thicker than the gates of the memory cells MC1-MC4. The thicknesses of the gates of the memory cells MC1-MC4 may be limited by the thicknesses of the second to fifth sacrificial layers 182 to 185, in order to allow a sufficient amount of current to be supplied to the memory cells strings.

Additionally, the first interlayer insulating layer 161 and the fifth interlayer insulating layer 165 are formed to be thicker than the second to fourth interlayer insulating layers 162 to 164. The thicknesses of the interlayer insulating layers 160 and the sacrificial layers 180 may vary from those shown in FIG. 8A. The number of layers constituting the interlayer insulating layers 160 and the sacrificial layers 180 may also vary.

Figure 8B:
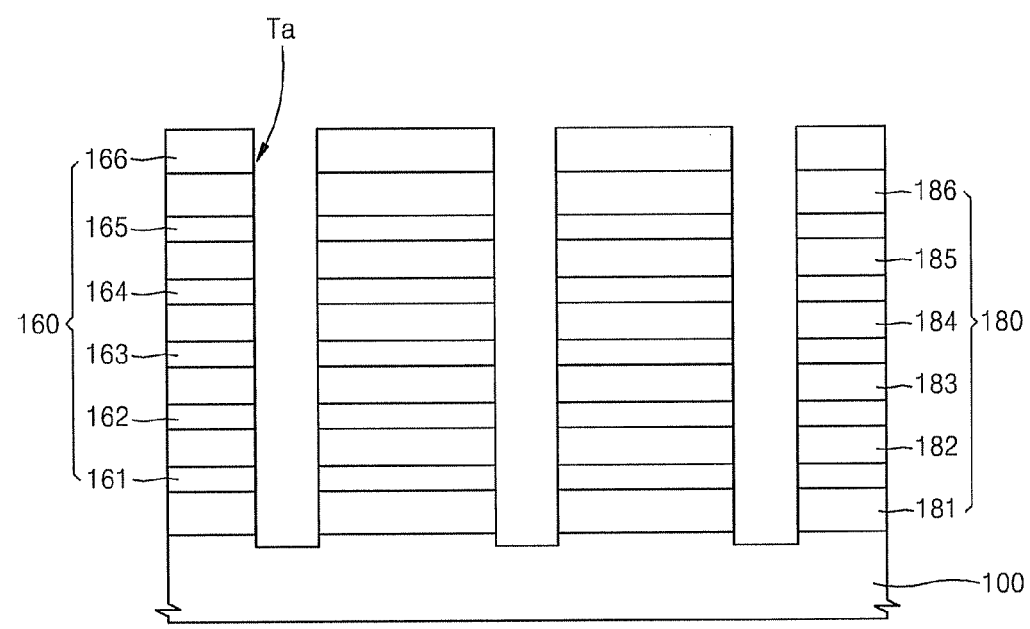

Referring to FIG. 8B, first openings Ta are formed through the interlayer insulating layers 160 and the sacrificial layers 180. The first openings Ta define regions in which the semiconductor regions 120 and the insulating layers 170 are formed. In this example, the first openings Ta are trenches extending in the y-axis direction with a depth in the z-axis direction. The first openings Ta are separated from one another in the x-axis direction by a given, desired or predetermined distance.

According to at least this example embodiment, the first openings Ta may be formed by forming a given, desired or predetermined mask pattern on the interlayer insulating layers 160 and the sacrificial layers 180 and alternately anisotropically etching the interlayer insulating layers 160 and the sacrificial layers 180 using the mask pattern as an etch mask. The mask pattern defines the regions that are to become the first openings Ta.

In at least the example embodiment shown in FIG. 8B, the first openings Ta are formed to expose the upper surface of the substrate 100. Furthermore, as a result of over-etching during the anisotropic etching, the first openings Ta are recessed from the upper surface of the substrate 100 by a given, desired or predetermined depth, as illustrated in FIG. 8B.

Figure 8C:
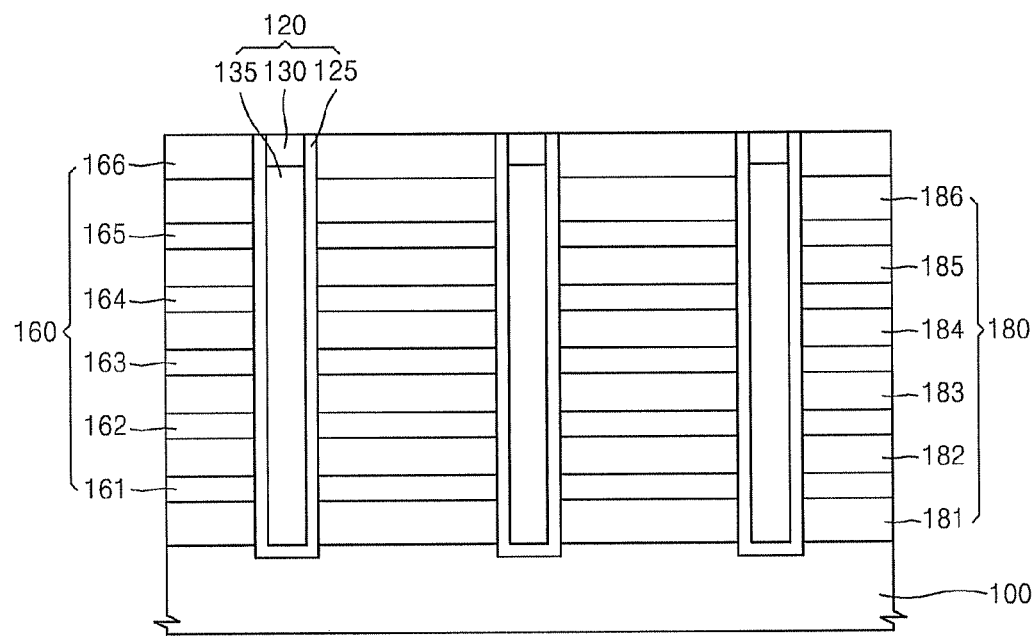

Referring to FIG. 8C, the semiconductor layers 125 are formed to conformally cover the sidewalls and the bottom of the first openings Ta shown in FIG. 8B. The semiconductor layers 125 may be formed of silicon or the like. For example, the semiconductor layers 125 may be formed as polycrystalline or monocrystalline Si epitaxial layers. The semiconductor layers 125 may be formed using atomic layer deposition (ALD) or chemical vapor deposition (CVD). The semiconductor layers 125 may be formed to have a thickness of about 1/50 to about 1/5, inclusive, of the width of the first openings Ta so that openings remain inside the semiconductor layers 125.

The openings inside the semiconductor layers 125 are at least partially filled with the insulating pillars 135. The insulating pillars 135 may include Undoped Silica Glass (USG), Spin On Glass (SOG), Tonen SilaZene (TOSZ), or the like. Alternatively, the semiconductor memory device fabrication method may further include hydrogen annealing of heating the structure with the semiconductor layers 125 in a gaseous atmosphere including hydrogen or heavy hydrogen before at least partially filling the openings with the insulating pillars 135. By performing the hydrogen annealing process, crystalline defects in the semiconductor layers 125 may be suppressed.

To remove the unnecessary semiconductor material and insulating material covering the uppermost interlayer insulating layer 166, a planarization process is conducted using, for example, chemical mechanical polishing (CMP) or an etch-back process until the upper surface of the interlayer insulating layer 166 is exposed. As a result, the semiconductor layers 125 and the insulating pillars 135 are formed within the first openings Ta. Upper regions of the insulating pillars 135 are removed, for example, through etching. The conductive layers 130 are then formed on the resulting insulating pillars 135. The conductive layers 130 may contain doped polysilicon or the like. A planarization process is again performed until the upper surfaces of the uppermost interlayer insulating layer 166 are exposed, so that the conductive layers 130 connected to the semiconductor layers 125 are formed on the insulating pillars 135.

According to at least some alternative example embodiments, the semiconductor layers 125 may be formed to completely fill the first openings Ta. In this case, the forming of the insulating pillars 135 described above may be omitted. The conductive layers 130 may be formed by injecting impurities into upper regions of the semiconductor layers 125.

Alternatively, to form a gate dielectric layer having the structure illustrated in FIG. 6B, for example, the tunnel insulating layers 141a may be formed on the sidewalls of the first openings Ta before forming the semiconductor layers 125 in the first openings Ta.

Figure 8D:
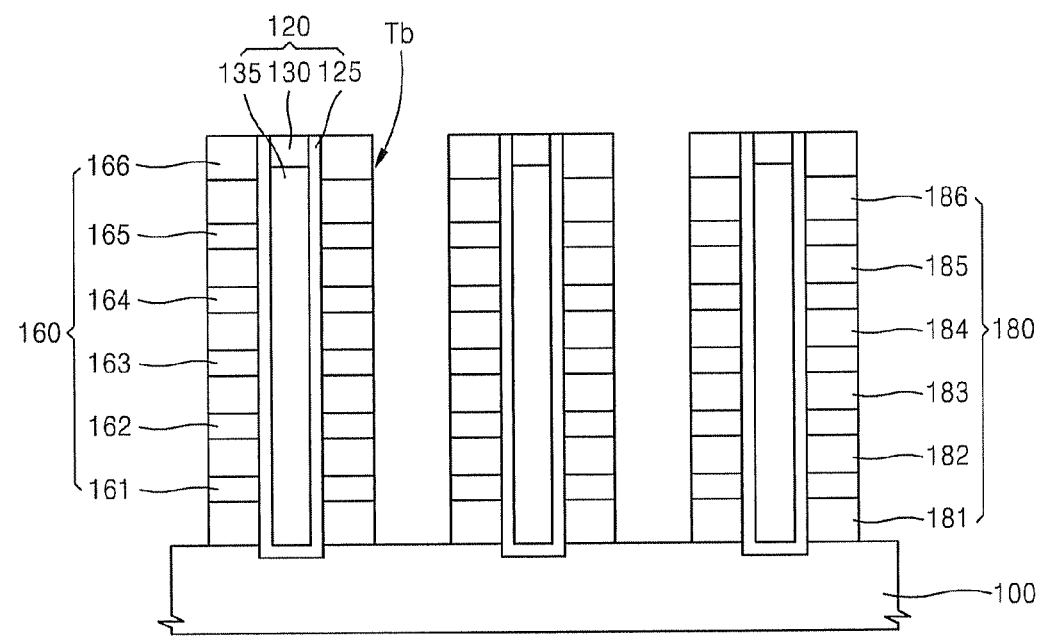

Referring to FIG. 8D, second openings Tb are formed through remaining portions of the interlayer insulating layers 160 and the sacrificial layers 180 to expose the substrate 100. In this example, each second opening Tb is formed to have a width slightly greater than a total width of the corresponding substrate contact electrode 110 and the insulating regions 115 on opposite sides of the substrate contact electrode 110. The second openings Tb are formed between the first openings Ta to be perpendicular or substantially perpendicular to the substrate 100.

According to at least one example embodiment, the second openings Tb may be formed by forming an etch mask defining the second openings Tb in the structure of FIG. 8C, and alternately anisotropically etching the interlayer insulating layers 160 and the sacrificial layers 180 underlying the etch mask until the upper surface of the substrate 100 is exposed.

As illustrated in FIG. 8D, the second openings Tb are formed to alternate with the first openings Ta in the x-axis direction. The number of first openings Ta and the number of second openings Tb, which are disposed in the x-axis direction with substantially the same y-axis coordinates, may be substantially the same. However, inventive concepts are not limited thereto. For example, the relative arrangement of the first and second openings Ta and Tb may be varied.

Figure 8E:
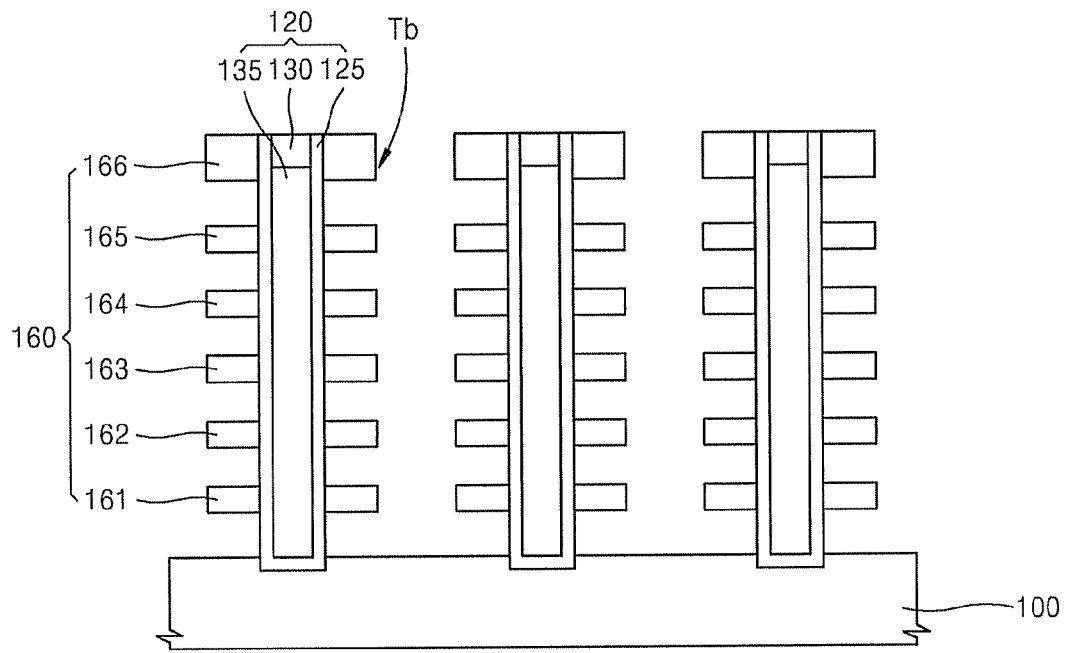

Referring to FIG. 8E, the sacrificial layers 180 exposed within the second openings Tb are selectively removed to create recess regions between the interlayer insulating layers 160. These recess regions may be air gaps extending horizontally from the second openings Tb. The recess regions are formed to at least partially expose the sidewalls of the semiconductor regions 120.

According to at least one example embodiment, the forming of the recess regions may include horizontally etching the sacrificial layers 180 using an etching method having an etch selectivity with respect to the interlayer insulating layers 160. For example, if the sacrificial layers 180 are silicon nitride layers, and the interlayer insulating layers 160 are silicon oxide layers, the horizontal etching process may be conducted using an etchant containing phosphoric acid.

Figure 8F:
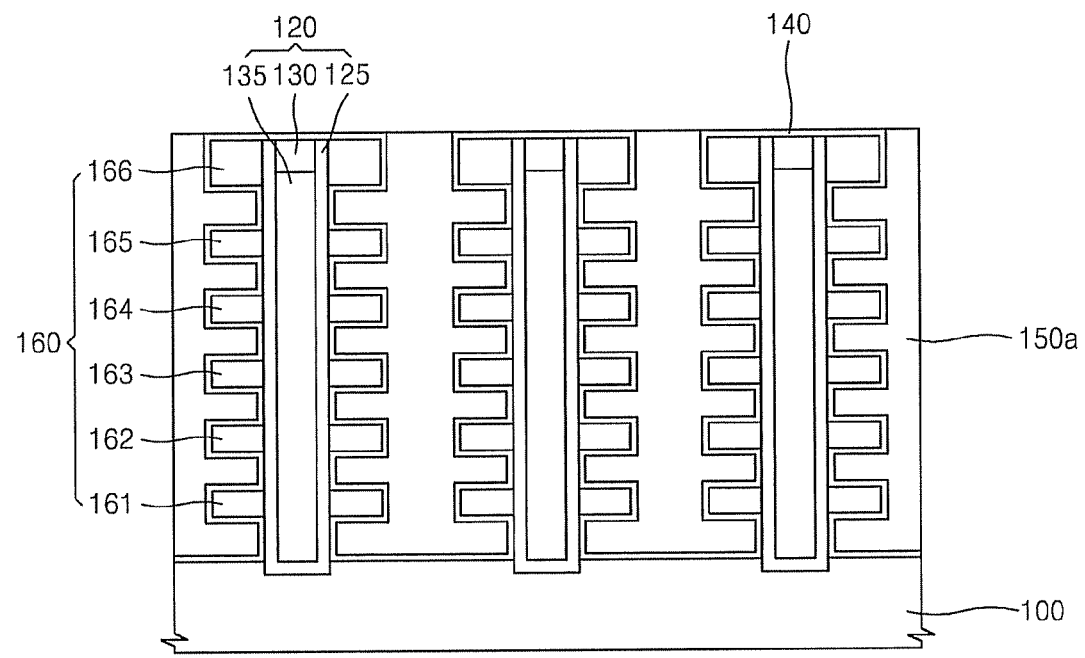

Referring to FIG. 8F, the gate dielectric layers 140 are formed to conformally cover the semiconductor regions 120, the interlayer insulating layers 160 and the substrate 100 exposed by the recess regions. As described above, each gate dielectric layer 140 may include a tunnel insulating layer, a charge storage layer and a barrier insulating layer. The tunnel insulating layer, the charge storage layer and the barrier insulating layer may be formed sequentially in the stated order so as to cover the semiconductor regions 120, the interlayer insulating layers 160, and the substrate 100. The tunnel insulating layer, the charge storage layer and the barrier insulating layer may be formed using ALD or CVD to have uniform or substantially uniform thickness. The gate dielectric layers 140 may also be formed on the upper surfaces of the uppermost interlayer insulating layers 166 and the conductive layers 130. In this regard, the gate dielectric layers 140 may suppress and/or prevent etching of the uppermost interlayer insulating layers 166, which will be described in more detail later.

The gate dielectric layers 140 are formed to a given, desired or predetermined thickness to conform to the second openings Tb and the recess regions, resulting in inner openings. The inner openings surrounded by the gate dielectric layers 140 may be completely filled with conductive layers 150a. The conductive layers 150a may include at least one conductive material selected from the group including doped silicon, metal, metal nitride, metal silicide, and the like. In one example, the conductive layers 150a may include tantalum nitride or tungsten. The conductive layers 150a may be formed by planarizing the conductive material covering the gate dielectric layers 140 on the top surfaces of the interlayer insulating layers 166 until the gate dielectric layers 140 are exposed.

Figure 8G:
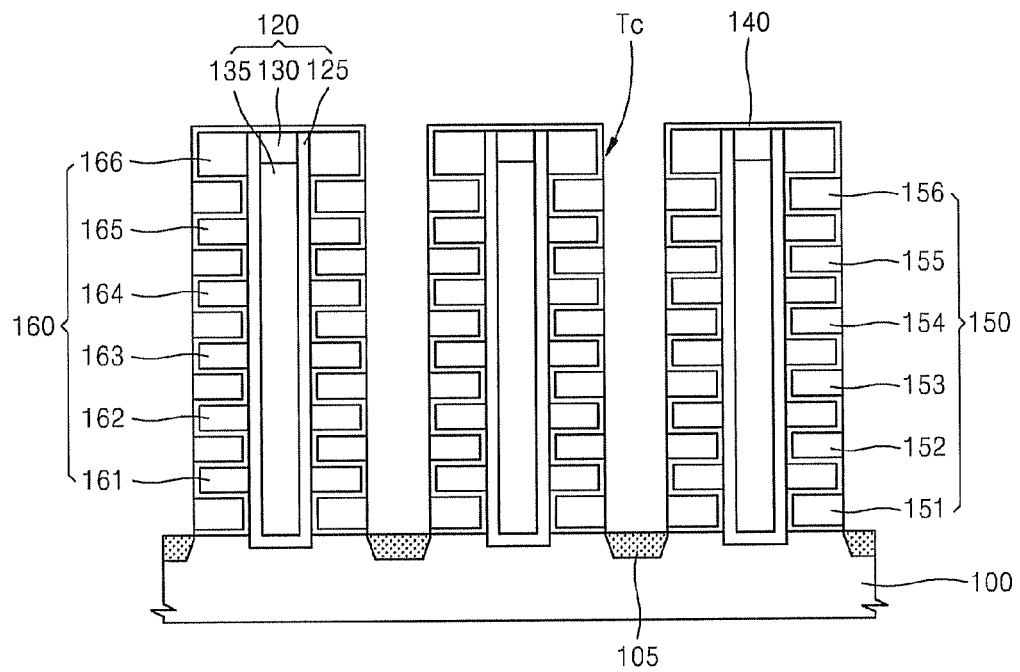

Referring to FIG. 8G, portions of the conductive layers 150a are removed to form third openings Tc exposing the upper surface of the substrate 100. The conductive layers 150a may be partially removed, for example, by anisotropic etching. As a result, the gate electrodes 150 are formed buried in the recess regions.

The gate dielectric layers 140 covering the upper surface of the substrate 100 are removed by anisotropic etching. The gate dielectric layers 140 formed on the sidewalls of the interlayer insulating layers 160 are also removed. The gate electrodes 150 buried in the recess regions are recessed towards the semiconductor regions 120 during the etching of the conductive layers 150a.

The impurity regions 105 extending in the y-axis direction adjacent to the upper surface of the substrate 100 are defined by injecting impurities into the substrate 100 through the third openings Tc. The impurity regions 105 may have the same conductivity type as that of the substrate 100 or a conductivity type opposite to that of the substrate 100. If the impurity regions 105 have a conductivity type opposite to that of the substrate 100, the impurity regions 105 may form P-N junctions with the substrate 100. The impurity regions 105 are electrically interconnected and have the same or substantially same potential.

Figure 8H:
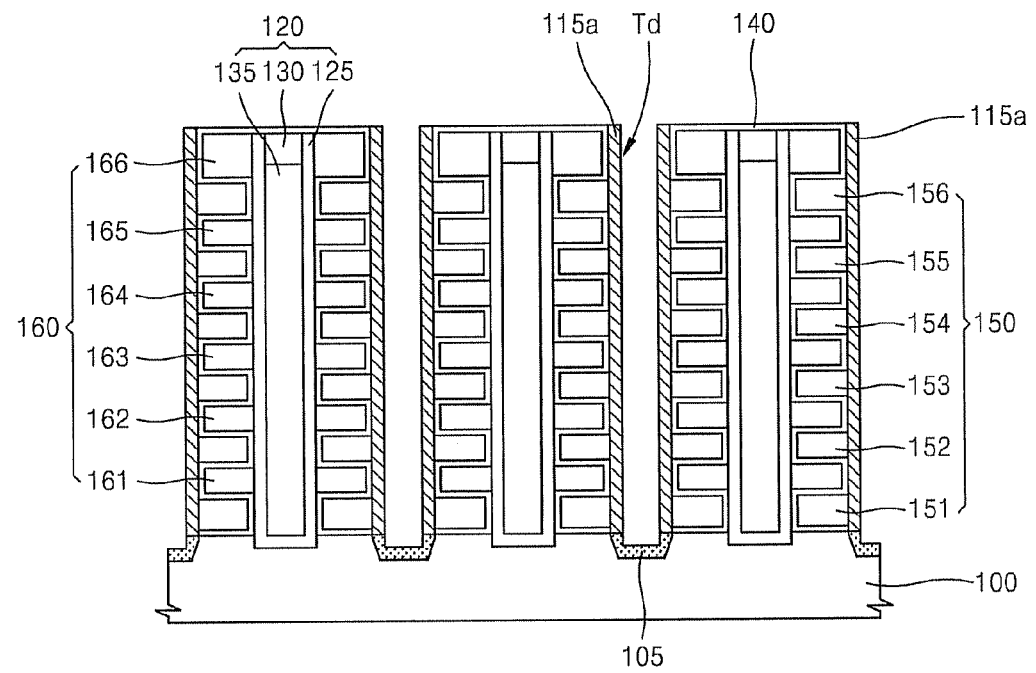

Referring to FIG. 8H, spacers 115a are formed on the sidewalls of the third openings Tc. The spacers 115a may be formed of an insulating material having an etch selectivity with respect to the gate electrodes 150 and the gate dielectric layers 140, and the barrier insulating layers 143 (as shown, e.g., in FIG. 6A) of the gate dielectric layers 140. The spacers 115a may be formed by filling the third openings Tc with the insulating material and selectively removing the insulating material by anisotropic etching. The spacers 115a formed by performing the anisotropic etching may have a given, desired or predetermined thickness resulting in fourth openings Td defined by the spacers 115a and having a smaller width than the third openings Tc. The upper surfaces of the impurity regions 105 may be over-etched to be recessed during the anisotropic etching.

Figure 8I:
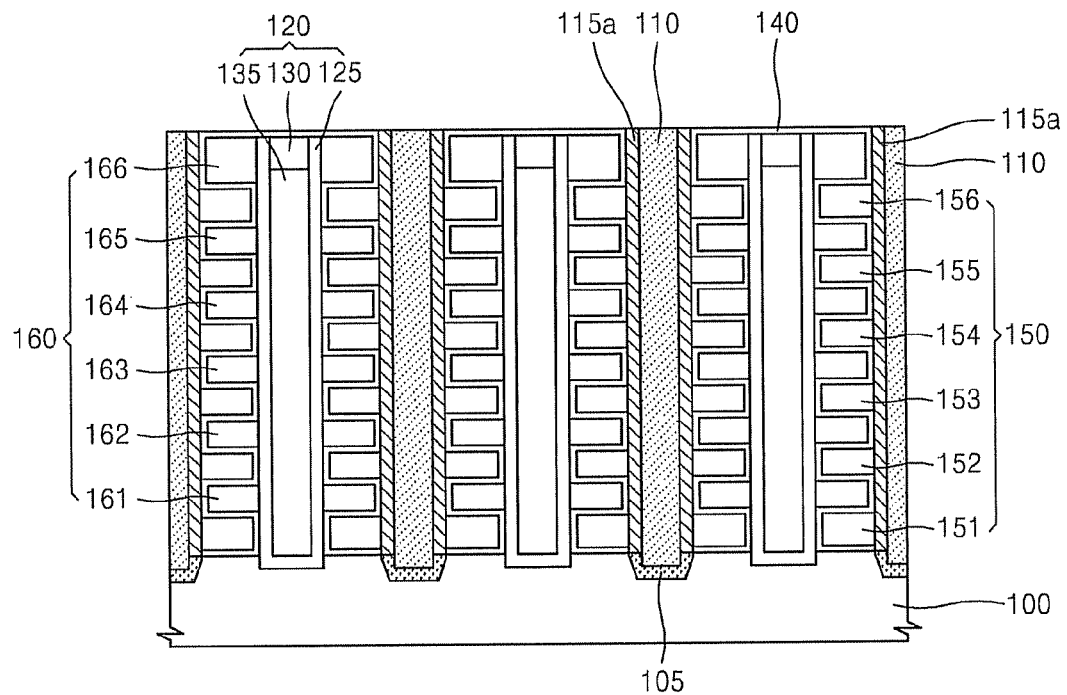

Referring to FIG. 8I, the fourth openings Td are filled with a conductive material to form the substrate contact electrodes 110 in ohmic-contact with the impurity regions 105. To reduce the contact resistance, silicide layers may be formed on the impurity regions 105 prior to the formation of the substrate contact electrodes 110. According to at least one example embodiment, the substrate contact electrodes 110 may be formed of tungsten.

Figure 8J:
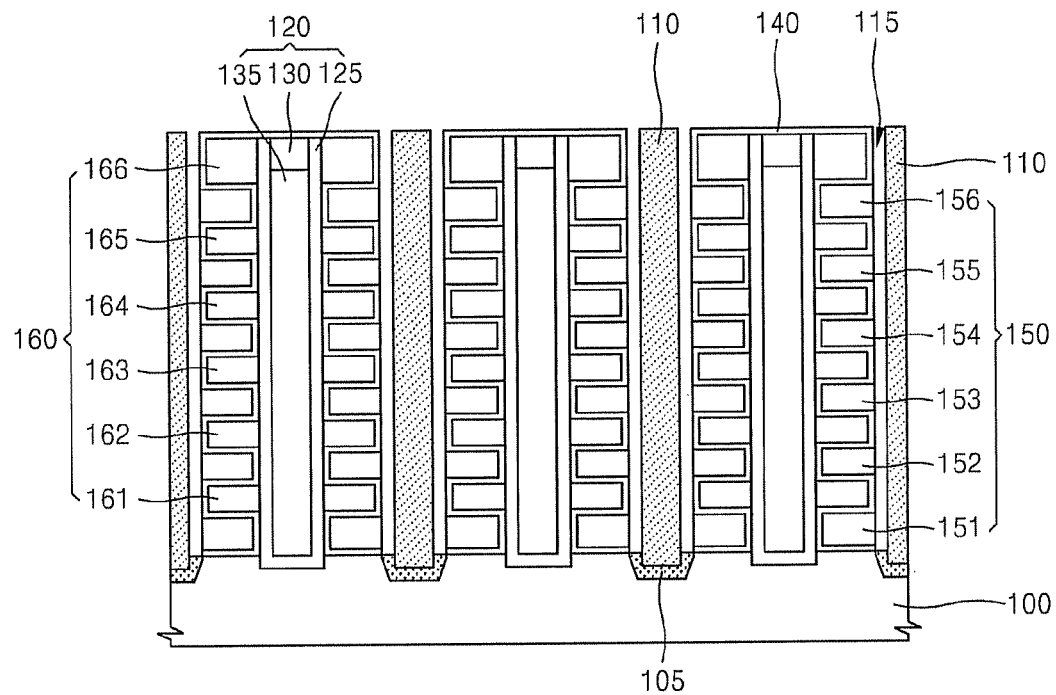

Referring to FIG. 8J, the spacers 115a on the sidewalls of the substrate contact electrodes 110 are removed to form the insulating regions 115 as air gaps. Because the spacers 115a have an etch selectivity with respect to the gate electrodes 150 and the gate dielectric layers 140, the spacers 115a may be removed without causing damage to the gate electrodes 150 and the gate dielectric layers 140. However, partial damage to the gate electrodes 150 and the gate dielectric layers 140 does not affect the structures of the transistors of the memory cell strings, and thus, the overall operation of the transistors remains unaffected. During the process of removing the spacers 115a, the uppermost interlayer insulating layers 166 are not removed because the gate dielectric layers 140 are disposed on the uppermost interlayer insulating layers 166.

Because the gate electrodes 150 and the substrate contact electrodes 110 are insulated from each other by air gaps, the voltage coupling from the gate electrodes 150 to the substrate contact electrodes 110 may be reduced. Furthermore, the dielectric breakdown voltage between the gate electrodes 150 and the substrate contact electrodes 110 may be increased, thereby increasing operational stability of the semiconductor memory device.

Figure 8K:
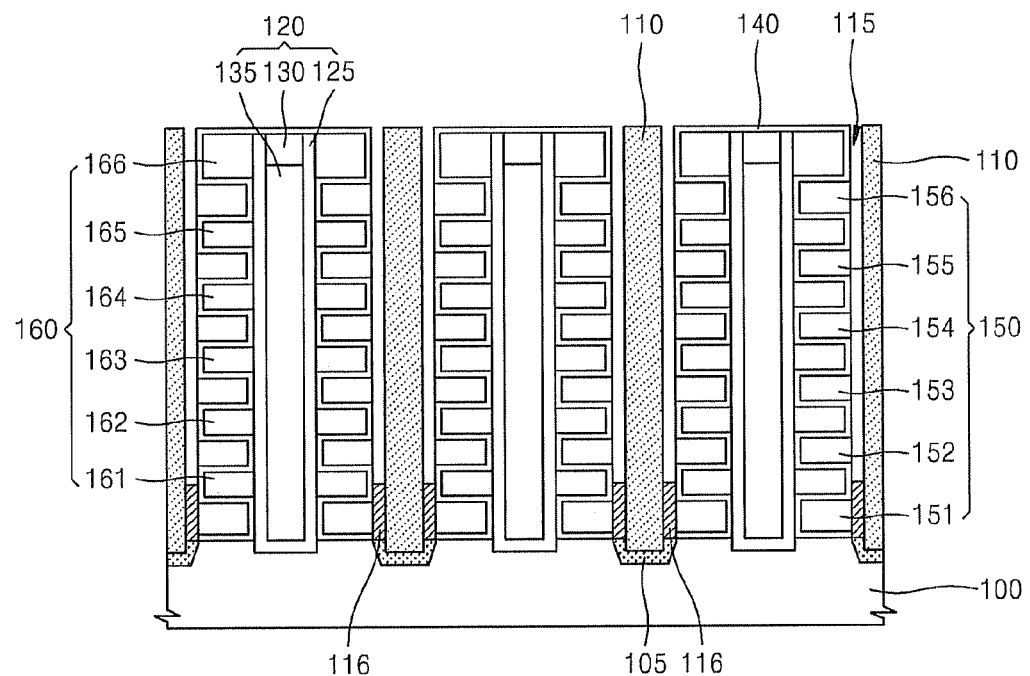

Alternatively, in the manufacture of the semiconductor memory device 1000a of FIG. 4A, the spacers 115a may be partially, but not fully, removed to a depth or level lower than the heights of the second gate electrodes 152, so that spacers 116 remain, as illustrated in FIGS. 4A and 8K. As described above, the second gate electrodes 152 used to form the transistors of the memory cells MC1 may electrically affect (e.g., significantly electrically affect) the substrate contact electrodes 110 because a relatively high voltage is applied to the second gate electrodes 152. Meanwhile, a relatively low voltage is applied to the first gate electrodes 151 of the ground selection transistors GST, and thus, the first gate electrodes 151 may have less electrical affect on the substrate contact electrodes 110. The spacers 116 may also support the substrate contact electrodes 110, thereby improving stability of the structure of the semiconductor memory device.

Referring back to FIG. 8I, to form the semiconductor regions 120 separated from one another in the y-axis direction, as illustrated in FIG. 3, an etch mask may be formed on the structure of FIG. 8I, and the semiconductor regions 120 may be partially anisotropically etched using the etch mask to form openings exposing the semiconductor substrate 100. An insulating material is deposited on the semiconductor substrate 100 to fill the openings, and then planarized to form the insulating layers 170 in FIG. 3. Alternatively, the processes involved in the formation of the insulating layers 170 separating the semiconductor regions 120 in the y-axis direction may performed on the structure of FIG. 8F, after completion of the processes described with reference to FIG. 8F. In this regard, the insulating layers 170 may be formed of a material having an etch selectivity with respect to the spacers 115a.

Figure 8L:
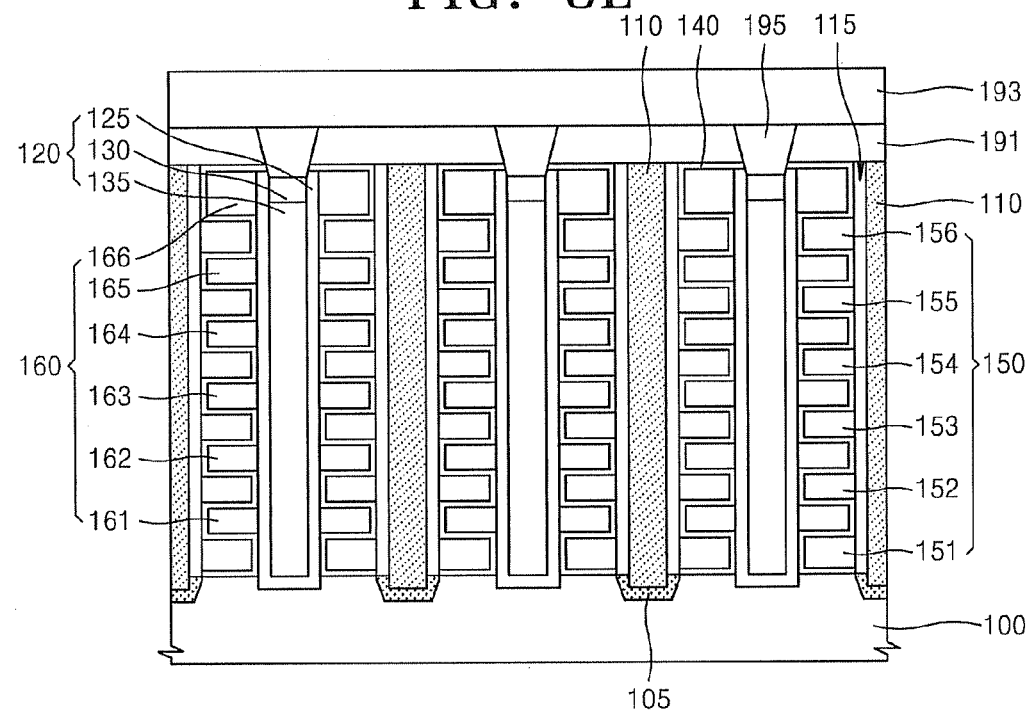

Moving to FIG. 8L, a capping layer 191 is formed on the structure shown in FIG. 8J. The capping layer 191 may be formed of a material selected such that the capping layer 191 does not fill the air gaps of the insulating regions 115 and/or using a method by which the air gaps are less likely to be filled. Bit line contact plugs 195 are formed on the conductive layers 130 of the semiconductor regions 120 so as to pass through the capping layers 191. The bit line contact plugs 195 may be formed using photolithography and/or etching. A bit line 193 connecting the bit line contact plugs 195, which are separated from one another in the x-axis direction, are formed on the capping layer 191. The bit line 193 may be formed as a line pattern using photolithography and/or etching.

FIGS. 9A through 9H are cross-sectional views of the semiconductor memory device 2000 of FIG. 5 in the y-axis direction, for describing a method of fabricating a semiconductor memory device according to another example embodiment.

Figure 9A:
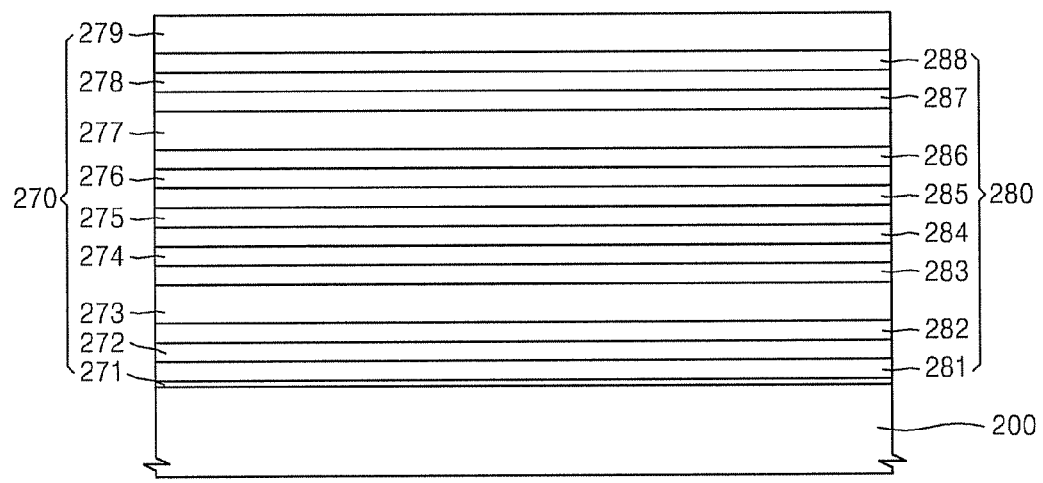
FIGS. 9A through 9H are cross-sectional views of the semiconductor memory device of FIG. 5 in a y-axis direction for describing a method of fabricating a semiconductor memory device according to an example embodiment.

Referring to FIG. 9A, insulating layers 270 and sacrificial layers 280 are stacked alternately on the substrate 200 beginning with a first insulating layer 271. The insulating layers 270 and the sacrificial layers 280 may be formed of materials having etch selectivities with respect to each other.

Figure 9B:
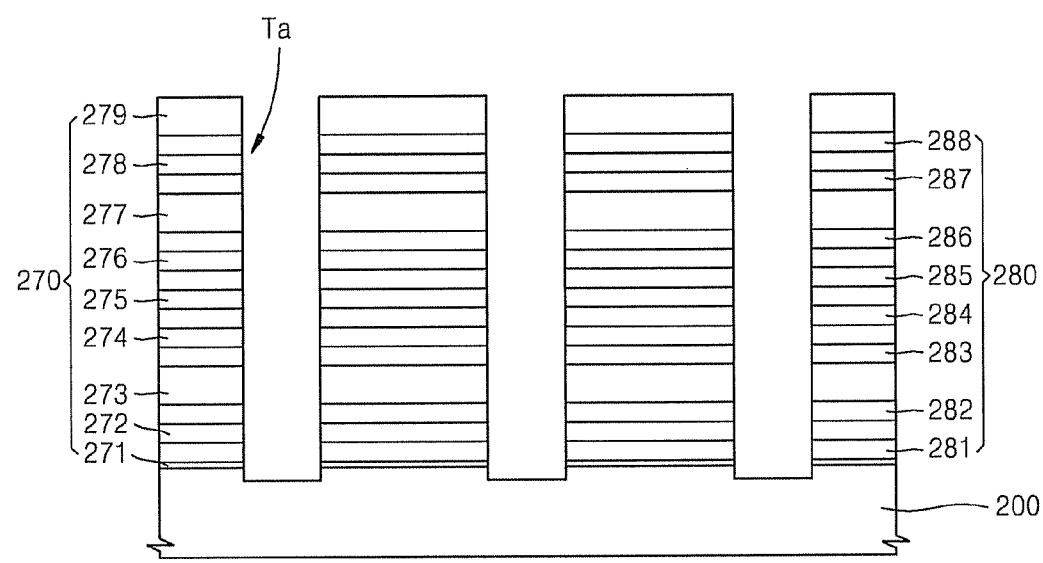

Referring to FIG. 9B, first openings Ta are formed through the insulating layers 270 and the sacrificial layers 280 to expose the substrate 200. The first openings Ta are disposed in a matrix formation and separated from one another in the x-axis and y-axis directions to correspond to the semiconductor regions 220 illustrated in FIG. 5.

Figure 9C:
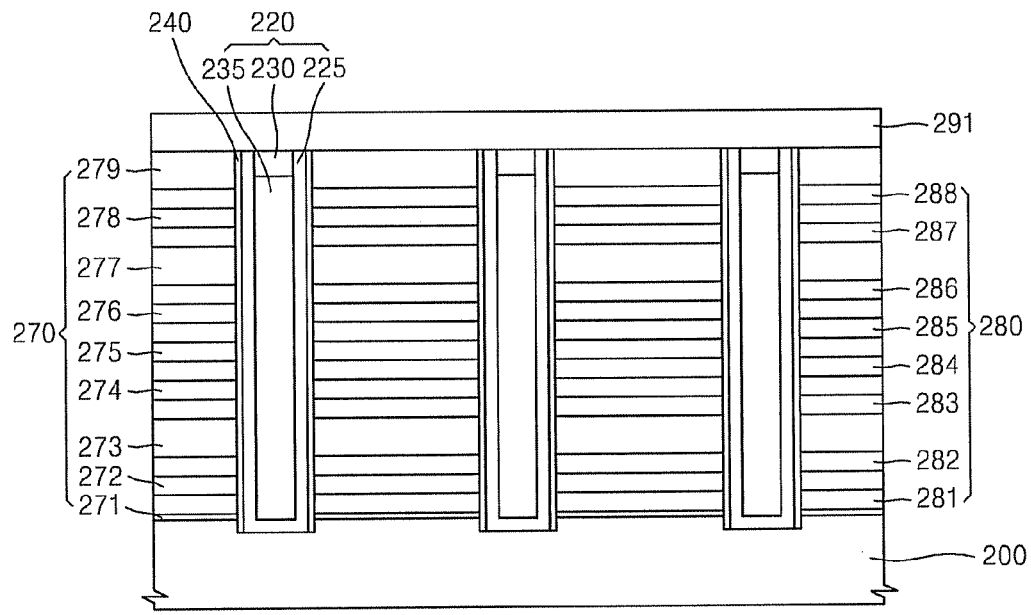

Referring to FIGS. 9C, gate dielectric layers 240, semiconductor layers 225, insulating pillars 235, and conductive layers 230 are formed within the first openings Ta. As described above, each gate dielectric layer 240 may include a tunnel insulating layer, a charge storage layer and a barrier insulating layer. The barrier insulating layers may be formed to conform to the sidewalls of the first openings Ta. The charge storage layers may then be formed to conform to the barrier insulating layers. The tunnel insulating layers may then be formed to conform to the charge storage layers.

The portions of the gate dielectric layers 240 on the substrate 200 are removed using anisotropic etching to expose the upper surface of the substrate 200. The semiconductor layers 225 are then formed to conform to the sidewalls of the gate dielectric layers 240 and the upper surface of the substrate 200. Openings defined by the semiconductor layers 225 are then at least partially filled with the insulating pillars 235. Upper regions of the insulating pillars 235 are removed, and the conductive layers 230 are formed on the remaining portions of the insulating pillars 235. The conductive layers 230 cover the upper surfaces of the insulating pillars 235 and are connected to the semiconductor layers 225.

The resulting structure is then planarized until the upper surfaces of the uppermost insulating layers 279 are exposed. An etch-stop layer 291 is formed on the remaining portions of the uppermost insulating layer 279.

Figure 9D:
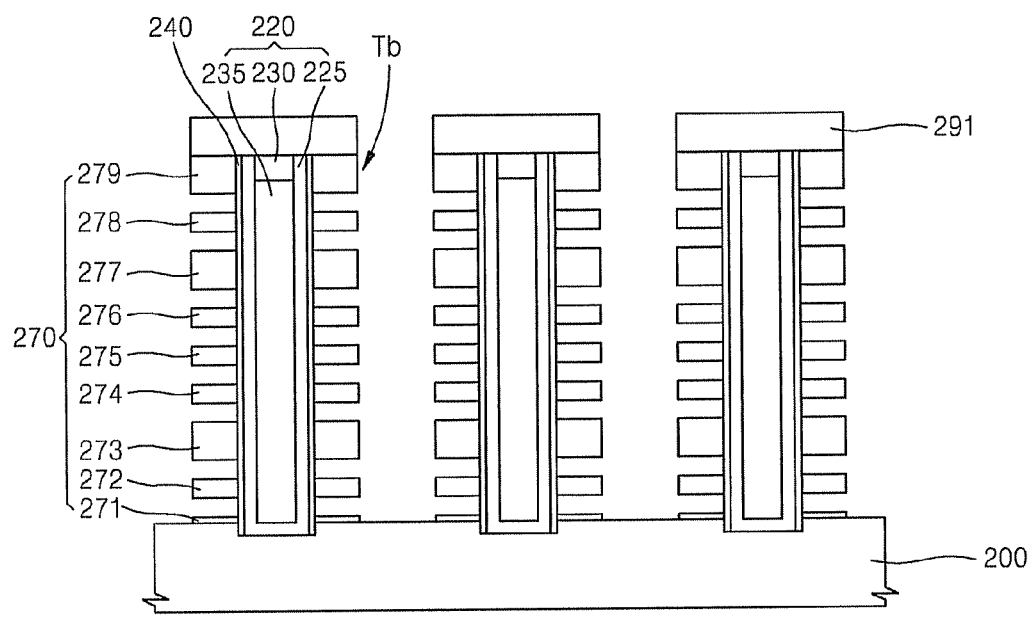

Referring to FIG. 9D, second openings Tb are formed through the regions of insulating layers 270 and sacrificial layers 280 between the semiconductor regions 220 disposed in the x-axis direction to expose the substrate 200. The second openings Tb may be formed using photolithography. For example, the second openings Tb may be formed by anisotropically etching the etch-stop layer 291, the insulating layers 270 and the sacrificial layers 280. The second openings Tb correspond to the insulating regions 215 and the substrate contact electrodes 210. The second openings Tb extend in the y-axis direction. The sacrificial layers 280 exposed by the second openings Tb are removed by etching to create recess regions above and below the insulating layers 270.

Figure 9E:
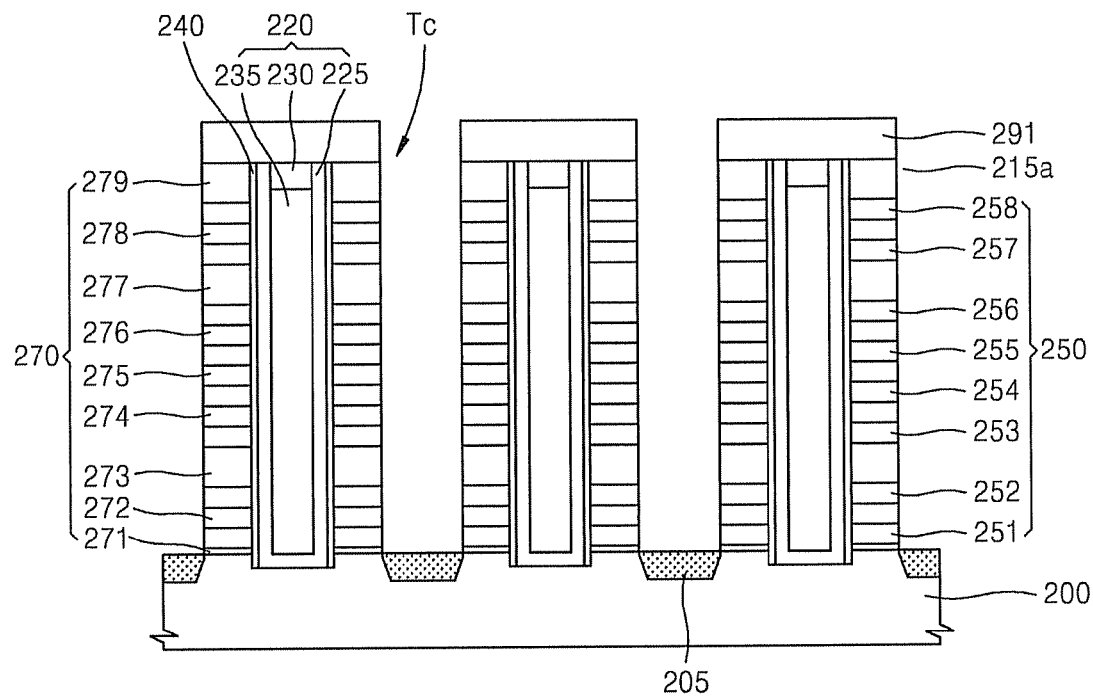

Referring to FIG. 9E, the second openings Tb and the recess regions are filled with a conductive material. The conductive material filling the second openings Tb is etched to form third openings Tc that are the same or substantially the same in width and location as the second openings Tb and also expose the substrate 200. The etching of the conductive material filling the second openings Tb creates gate electrodes 250 surrounding the semiconductor regions 220. Impurity regions 205 are defined by injecting impurities into the substrate 200 through the third openings Tc.

Figure 9F:
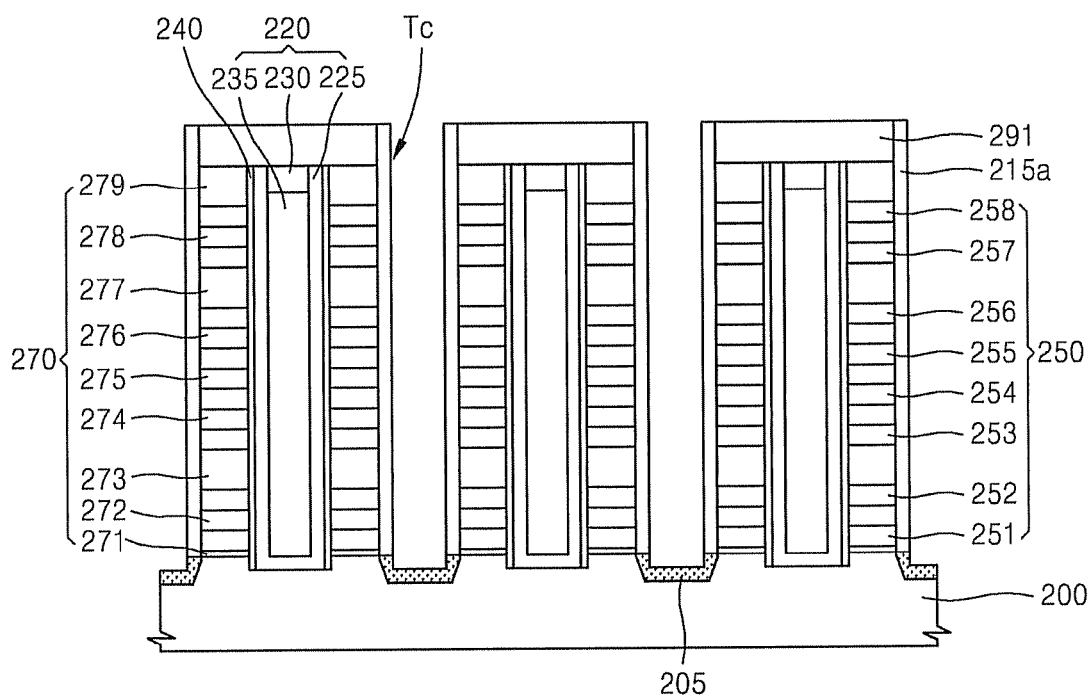

Referring to FIG. 9F, spacers 215a are formed on the sidewalls of the third openings Tc. The spacers 215a may be formed of a material having an etch selectivity with respect to the etch-stop layer 291. The spacers 215a may be formed of the same or substantially the same material as that of the insulating layers 270. In one example, the spacers 215a are formed by filling the third openings Tc with such a material and anisotropically etching the material. In the example embodiment shown in FIG. 9F, the substrate 200 is over-etched to be recessed during the anisotropic etching. The spacers 215a define fourth openings Td exposing the substrate 200.

Figure 9G:
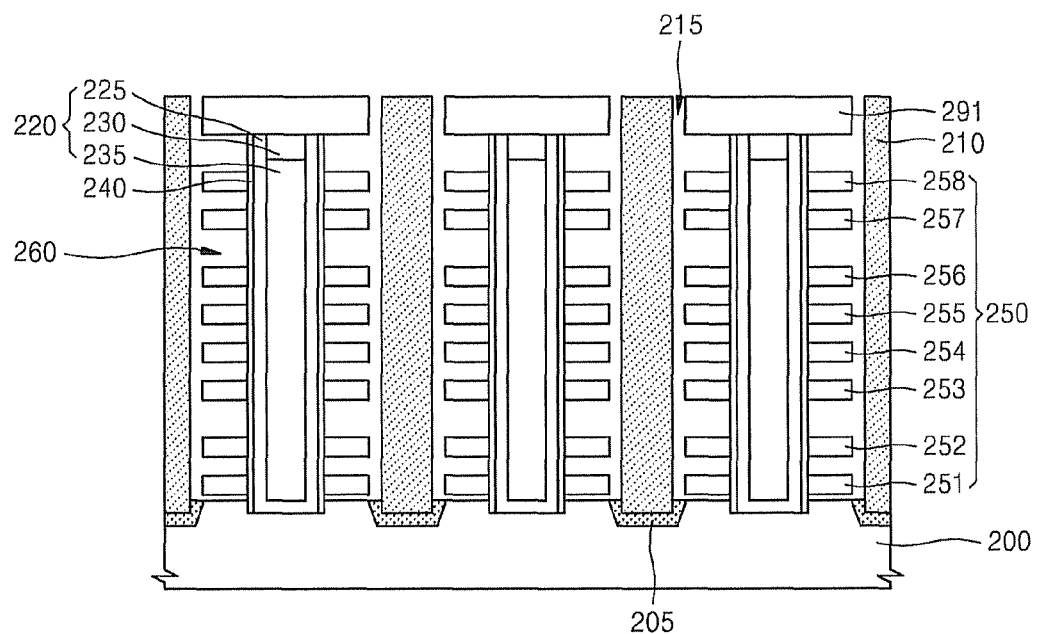

Referring to FIG. 9G, the fourth openings Td are filled with a conductive material to form substrate contact electrodes 210. The spacers 215a and the insulating layers 270 are then removed by etching. During the etching, the gate dielectric layers 240 may be protected by the etch-stop layer 291. As a result, the gate electrodes 250 are insulated from the substrate contact electrodes 210 by insulating regions 215 formed as air gaps.

Figure 9H:
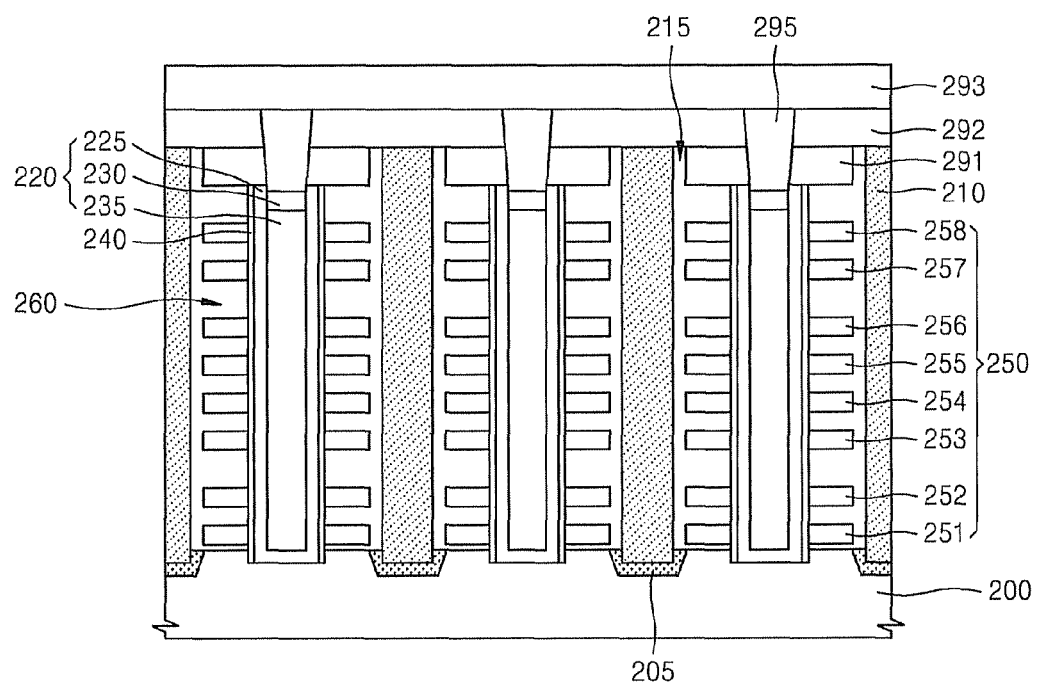

Referring to FIG. 9H, a capping layer 292 is formed on the etch-stop layer 291 and the substrate contact electrodes 210. The capping layer 292 may be formed of a material selected such that the capping layer 292 does not fill the air gaps of the insulating regions 215 and/or using a method by which the air gaps are less likely to be filled. Bit line contact plugs 295 are formed on the conductive layers 230 of the semiconductor regions 220 to pass through the etch-stop layers 291 and the capping layer 292. A bit line 293 is formed to connect to the bit line contact plugs 295, which are separated from one another in the x-axis direction.

Figure 10:
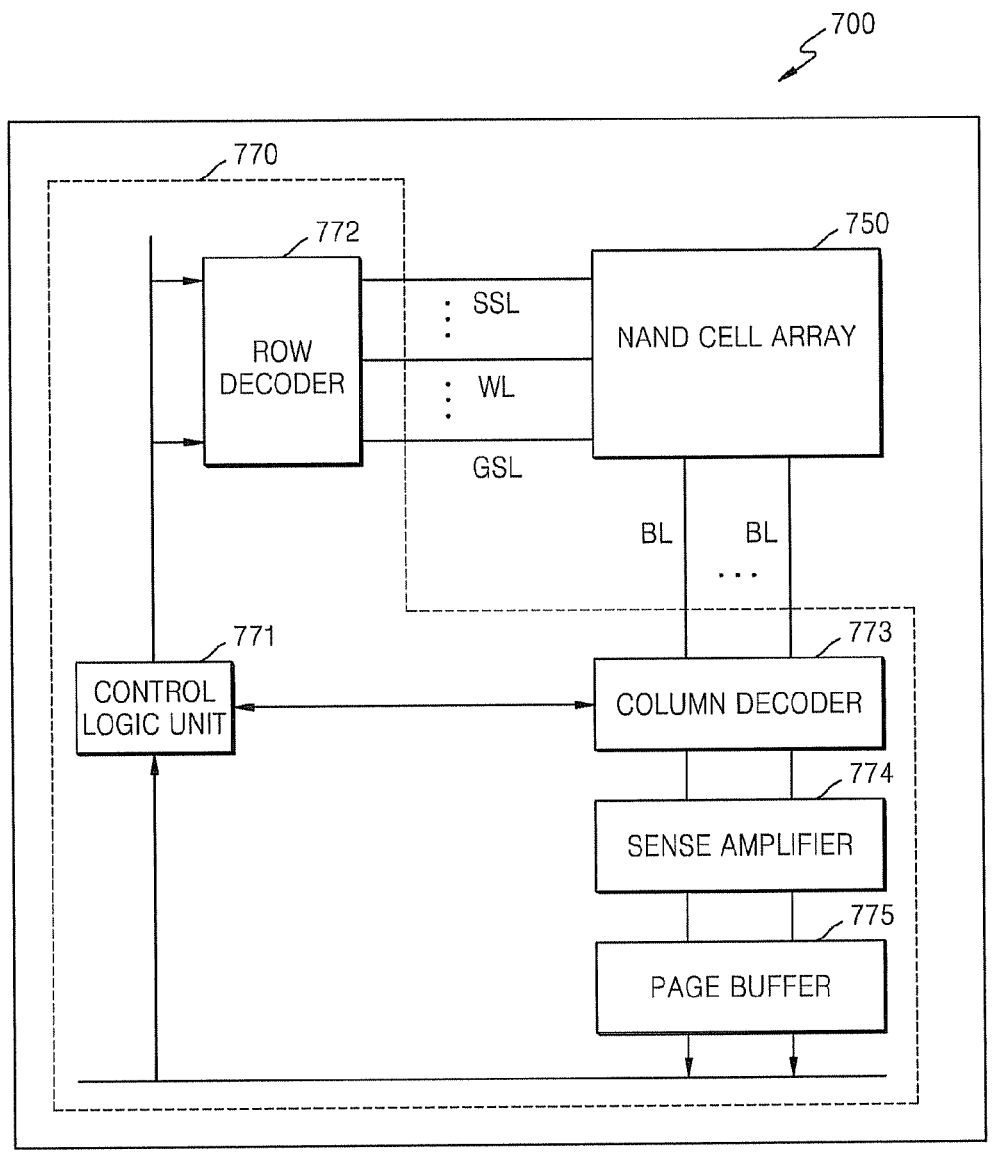
FIG. 10 is a block diagram of a semiconductor memory device according to an example embodiment.

FIG. 10 is a block diagram illustrating a semiconductor memory device 700 according to an example embodiment.

Referring to the semiconductor memory device 700 shown in FIG. 10, a NAND cell array 750 is coupled to a core circuit 770. According to at least one example embodiment, the NAND cell array 750 may include at least one of the semiconductor memory devices 1000, 1000a-1000d and 2000 described above with reference to FIGS. 4A to 4D and FIG. 5. The core circuit 770 includes a control logic unit 771, a row decoder 772, a column decoder 773, a sense amplifier 774, and a page buffer 775.

The control logic unit 771 communicates with the row decoder 772, the column decoder 773, and the page buffer 775. The row decoder 772 communicates with the NAND cell array 750 via a plurality of string selection lines SSL, a plurality of word lines WL, and a plurality of ground selection lines GSL. The column decoder 773 communicates with the NAND cell array 750 via a plurality of bit lines BL. The sense amplifier 774 is connected to the column decoder 733 to receive an output from the column decoder 773 when a signal is output from the NAND cell array 750. However, the sense amplifier 774 may be disconnected from the column decoder 733 when a signal is transmitted to the NAND cell array 750.

In example operation, the control logic unit 771 transmits a row address signal to the row decoder 772, and the row decoder 772 decodes the row address signal and transmits the same to the NAND cell array 750 via the string selection lines SSL, the word lines WL, and the ground selection lines GSL. The control logic unit 771 transmits a column address signal to the column decoder 773 or the page buffer 775, and the column decoder 773 decodes the column address signal and transmit the same to the NAND cell array 750 via the bit lines BL. Signals from the NAND cell array 750 are transmitted to the sense amplifier 774 via the column decoder 773, amplified in the sense amplifier 774 and transmitted through the page buffer 775 to the control logic unit 771.

Figure 11:
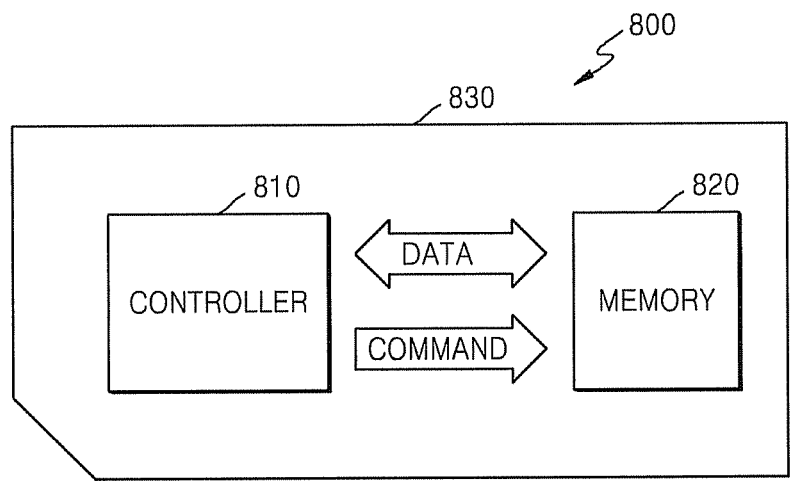
FIG. 11 is a schematic view illustrating a memory card according to an example embodiment.

FIG. 11 is a schematic view illustrating a memory card 800 according to an example embodiment.

Referring to FIG. 11, the memory card 800 includes a controller 810 and a memory unit 820, which are installed in a housing 830. The controller 810 and the memory unit 820 exchange electrical signals. For example, the memory unit 820 and the controller 810 exchange data according to a command from the controller 810. The memory card 800 stores data in the memory unit 820 or externally outputs data from the memory unit 820.

For example, the memory unit 820 may include at least one of the semiconductor memory devices 1000, 1000a-1000d and 2000 described above with reference to FIG. 3, FIGS. 4A to 4D, and FIG. 5. The memory card 800 may be used as a data storage medium of various types of portable appliances. For example, the memory card 800 may be a multimedia card (MMC) or a secure digital (SD) card.

Figure 12:
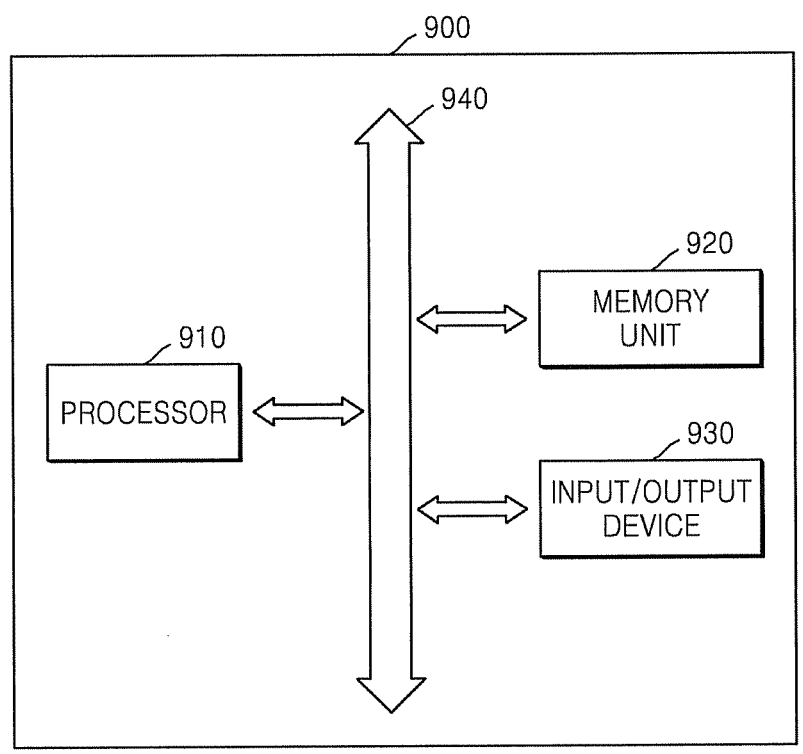
FIG. 12 is a block diagram of an electronic system according to an example embodiment.

FIG. 12 is a block diagram illustrating an electronic system 900 according to an example embodiment.

Referring to FIG. 12, the electronic system 900 includes a processor 910, an input/output unit 930, and a memory unit 920. Data communication between the processor 910, the input/output unit 930 and the memory unit 920 is conducted via a bus 940. The processor 910 executes programs and controls the electronic system 900. The input/output unit 930 is usable to input data to or output data from the electronic system 900. The electronic system 900 may be connected to an external device (not shown), for example, a personal computer or a network, via the input/output unit 930 to exchange data with the external device. The memory unit 920 stores code and/or data for operation of the processor 910.

According to at least some example embodiments, the memory unit 920 may include at least one of the semiconductor memory devices 1000, 1000a-1000d and 2000 described above with reference to FIG. 3, FIGS. 4A to 4D, and FIG. 5.

The electronic system 900 may include various types of electronic controllers including the memory unit 920. For example, the electronic system 900 may be used in a mobile phone, an MP3 player, a navigation device, a solid state disk (SSD), or other household appliances.

While inventive concepts have been particularly shown and described with reference to example embodiments thereof, it will be understood that various changes in form and details may be made therein without departing from the spirit and scope of the following claims.

What is claimed is:
1. A semiconductor memory device comprising:
a semiconductor region extending vertically from a first region of a substrate;
a plurality of gate electrodes disposed on the first region of the substrate in a vertical direction, the plurality of gate electrodes being separated from one another and being disposed along a sidewall of the semiconductor region;

a gate dielectric layer disposed between the semiconductor region and the plurality of gate electrodes;

a substrate contact electrode extending vertically from an impurity-doped second region of the substrate, the substrate contact electrode extending from the substrate to a height greater than that of an uppermost gate electrode from among the plurality of gate electrodes; and an insulating region formed as an air gap between the substrate contact electrode and at least one of the plurality of gate electrodes.

2. The semiconductor memory device of claim 1, further comprising:

an insulating pillar extending vertically from the first region of the substrate; wherein sidewalls and an upper surface of the insulating pillar are covered by the semiconductor region.

3. The semiconductor memory device of claim 1, wherein the gate dielectric layer comprises:

a tunnel insulating layer, a charge storage layer and a barrier insulating layer that are sequentially stacked on the semiconductor region.

4. The semiconductor memory device of claim 1, wherein the gate dielectric layer is disposed to extend vertically from the substrate along the sidewall of the semiconductor region.

5. The semiconductor memory device of claim 1, wherein the gate dielectric layer is disposed to cover upper and lower surfaces of the plurality of gate electrodes.

6. The semiconductor memory device of claim 1, wherein the gate dielectric layer is disposed between the substrate and a lowermost gate electrode from among the plurality of gate electrodes, and wherein a region of the substrate between the semiconductor region and the impurity-doped second region serves as a channel of a transistor including the lowermost gate electrode.

7. The semiconductor memory device of claim 1, wherein edge regions of the impurity-doped second region of the substrate have a height greater than that of a lower surface of the substrate contact electrode.

8. The semiconductor memory device of claim 1, wherein the insulating region covers an upper surface, a side surface, and a lower surface of each one of the plurality of gate electrodes.

9. The semiconductor memory device of claim 1, wherein the plurality of gate electrodes are spaced apart from each other in the vertical direction, and the insulating region is directly between the substrate contact electrode and a stack of the plurality of gate electrodes.

10. The semiconductor memory device claim 1, wherein an inner surface of the semiconductor region defines an opening that exposes a portion of an upper surface of the substrate.

11. The semiconductor memory device claim 10, further comprising:

an insulating pillar extending vertically from the portion of the upper surface of the substrate, wherein the insulating pillar is in the opening defined by the inner surface of the semiconductor region.

12. The semiconductor memory device claim 1, further comprising:

a plurality of semiconductor regions extending vertically from an upper surface of the substrate; and a plurality of substrate contact electrodes extending vertically from the substrate, wherein each one of the plurality of substrate contact electrodes is between a corresponding pair of the plurality of semiconductor regions, the plurality of semiconductor regions include the semiconductor region extending vertically from the first region of the substrate, and the plurality of substrate contact electrodes include the substrate contact electrode extending vertically from the impurity-doped second region of the substrate.

13. The semiconductor memory device claim 1, further comprising:

an etch-stop layer on a top of the semiconductor region;

a capping layer on top of the etch-stop layer;

a bit line on top of the capping layer, capping layer insulating the bit line from the substrate contact electrode; and a bit line plug extending vertically through the capping layer and the etch stop layer to electrically connect the top of the semiconductor region to the bit line.

14. A semiconductor memory device comprising:

a semiconductor region extending vertically from a first region of a substrate;

a plurality of gate electrodes disposed on the first region of the substrate in a vertical direction, the plurality of gate electrodes being separated from one another and being disposed along a sidewall of the semiconductor region;

a gate dielectric layer disposed between the semiconductor region and the plurality of gate electrodes;

a substrate contact electrode extending vertically from an impurity-doped second region of the substrate, the substrate contact electrode extending from the substrate to one of, a height greater than that of an uppermost gate electrode from among the plurality of gate electrodes, and to a height less than the height of a gate electrode of a lowermost memory cell transistor from among memory cell transistors of a memory cell string; and an insulating region formed as an air gap between the substrate contact electrode and at least one of the plurality of gate electrodes.

15. The semiconductor memory device of claim 14, wherein the substrate contact electrode extends from the substrate to the height less than the height of the gate electrode of the lowermost memory cell transistor from among memory cell transistors of the memory cell string.

* * * * *